US012785650B2

(12) United States Patent
Daimon

(10) Patent No.: US 12,785,650 B2
(45) Date of Patent: Nov. 3, 2026

(54) ACOUSTIC WAVE DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 868 days.

(21) Appl. No.: 18/124,592

(22) Filed: Mar. 22, 2023

(65) Prior Publication Data

US 2023/0327641 A1 Oct. 12, 2023

Related U.S. Application Data

(63) Continuation of application No. PCT/JP2021/035803, filed on Sep. 29, 2021.

(30) Foreign Application Priority Data

Oct. 6, 2020 (JP) ................................ 2020-169095

(51) Int. Cl.
*H03H 9/02* (2006.01)
*H03H 9/25* (2006.01)

(52) U.S. Cl.
CPC .... *H03H 9/02574* (2013.01); *H03H 9/02559* (2013.01); *H03H 9/02566* (2013.01); *H03H 9/25* (2013.01)

(58) Field of Classification Search
CPC ........... H03H 9/02574; H03H 9/02559; H03H 9/02566; H03H 9/25
USPC ...... 310/313 R, 313 A, 313 B, 313 C, 313 D
See application file for complete search history.

(56) References Cited

U.S. PATENT DOCUMENTS

| | | | | |
|---|---|---|---|---|
| 2018/0159495 | A1* | 6/2018 | Inoue | H03H 9/02866 |
| 2019/0372552 | A1* | 12/2019 | Gaudin | H03H 9/02818 |
| 2020/0028486 | A1 | 1/2020 | Kishino et al. | |
| 2020/0161533 | A1* | 5/2020 | Shibata | H03H 3/08 |
| 2020/0204150 | A1 | 6/2020 | Iwamoto | |
| 2020/0220518 | A1 | 7/2020 | Omura | |

(Continued)

FOREIGN PATENT DOCUMENTS

| | | | |
|---|---|---|---|
| CN | 109417124 | A | 3/2019 |
| JP | 2019021994 | A | 2/2019 |
| JP | 2019526194 | A | 9/2019 |

(Continued)

OTHER PUBLICATIONS

International Search Report in PCT/JP2021/035803, mailed Dec. 7, 2021, 4 pages.

(Continued)

*Primary Examiner* — Derek J Rosenau
(74) *Attorney, Agent, or Firm* — Keating & Bennett, LLP

(57) ABSTRACT

An acoustic wave device includes a silicon substrate, a polysilicon layer provided on the silicon substrate, a silicon oxide layer directly or indirectly provided on the polysilicon layer, a piezoelectric layer directly or indirectly provided on the silicon oxide layer, and an interdigital transducer electrode provided on the piezoelectric layer. A plane orientation of the silicon substrate is any one of (100), (110), and (111), and, where a wave length that is defined by an electrode finger pitch of the interdigital transducer electrode is λ, a thickness of the piezoelectric layer is less than or equal to about 1λ.

22 Claims, 11 Drawing Sheets

(56) References Cited

U.S. PATENT DOCUMENTS

| | | | |
|---|---|---|---|
| 2020/0287513 | A1 | 9/2020 | Yamamoto et al. |
| 2022/0216844 | A1 | 7/2022 | Yamane et al. |

FOREIGN PATENT DOCUMENTS

| | | | |
|---|---|---|---|
| WO | 2017209131 | A1 | 12/2017 |
| WO | 2018151147 | A1 | 8/2018 |
| WO | 2019049608 | A1 | 3/2019 |
| WO | 2019065666 | A1 | 4/2019 |
| WO | 2019111893 | A1 | 6/2019 |
| WO | 2021060513 | A1 | 4/2021 |

OTHER PUBLICATIONS

Written Opinion in PCT/JP2021/035803, mailed Dec. 7, 2021, 5 pages.

Official Communication issued in corresponding Chinese Patent Application No. 202180066035.3, mailed on June 8, 2026, 9 pages.

* cited by examiner

ACOUSTIC WAVE DEVICE

CROSS REFERENCE TO RELATED APPLICATIONS

This application claims the benefit of priority to Japanese Patent Application No. 2020-169095 filed on Oct. 6, 2020 and is a Continuation Application of PCT Application No. PCT/JP2021/035803 filed on Sep. 29, 2021. The entire contents of each application are hereby incorporated herein by reference.

BACKGROUND OF THE INVENTION

1. Field of the Invention

The present invention relates to an acoustic wave device.

2. Description of the Related Art

Hitherto, acoustic wave devices are widely used in filters of mobile phones, and the like. International Publication No. 2018/151147 describes an example of the acoustic wave devices. In the acoustic wave device, an interdigital transducer electrode is provided on a multilayer substrate. In the multilayer substrate, a silicon substrate, a silicon oxide layer, a silicon nitride layer, and a piezoelectric substrate are laminated in this order. The plane orientation of the silicon substrate is set to (100), (110), or (111). Thus, a bulk wave spurious is reduced or prevented.

SUMMARY OF THE INVENTION

However, even when the plane orientation of the silicon substrate is set to (100), (110), or (111) as in the case of the acoustic wave device described in International Publication No. 2018/151147, it is difficult to sufficiently reduce ripple caused by higher-order modes.

Preferred embodiments of the present invention provide acoustic wave devices each capable of reducing higher-order modes in a wide band.

An acoustic wave device according to a preferred embodiment of the present invention includes a silicon substrate, a polysilicon layer provided on the silicon substrate, a silicon oxide layer directly or indirectly provided on the polysilicon layer, a piezoelectric layer directly or indirectly provided on the silicon oxide layer, and an interdigital transducer electrode provided on the piezoelectric layer. A plane orientation of the silicon substrate is any one of (100), (110), and (111). Where a wave length that is defined by an electrode finger pitch of the interdigital transducer electrode is λ, a thickness of the piezoelectric layer is less than or equal to about 1λ.

With the acoustic wave devices according to preferred embodiments of the present invention, higher-order modes are reduced in a wide band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

It should be noted that each of the preferred embodiments described in the specification is illustrative and that partial replacements or combinations of components are possible among different preferred embodiments.

Figure 1:
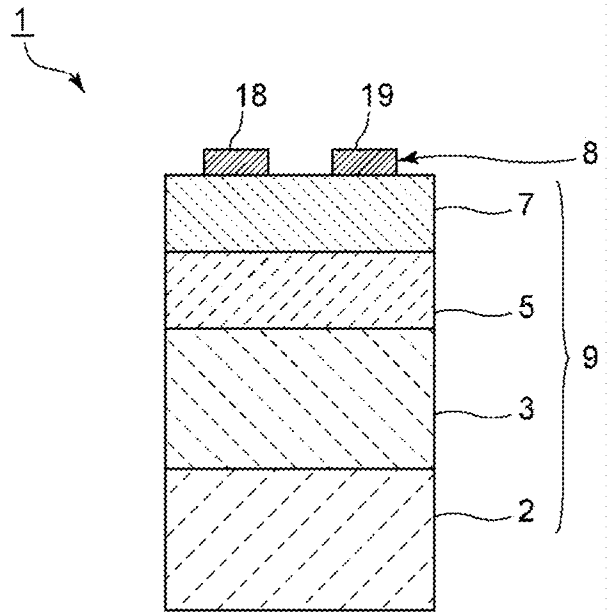
FIG. 1 is an elevational cross-sectional view of a portion of an acoustic wave device according to a first preferred embodiment of the present invention.
Figure 2:
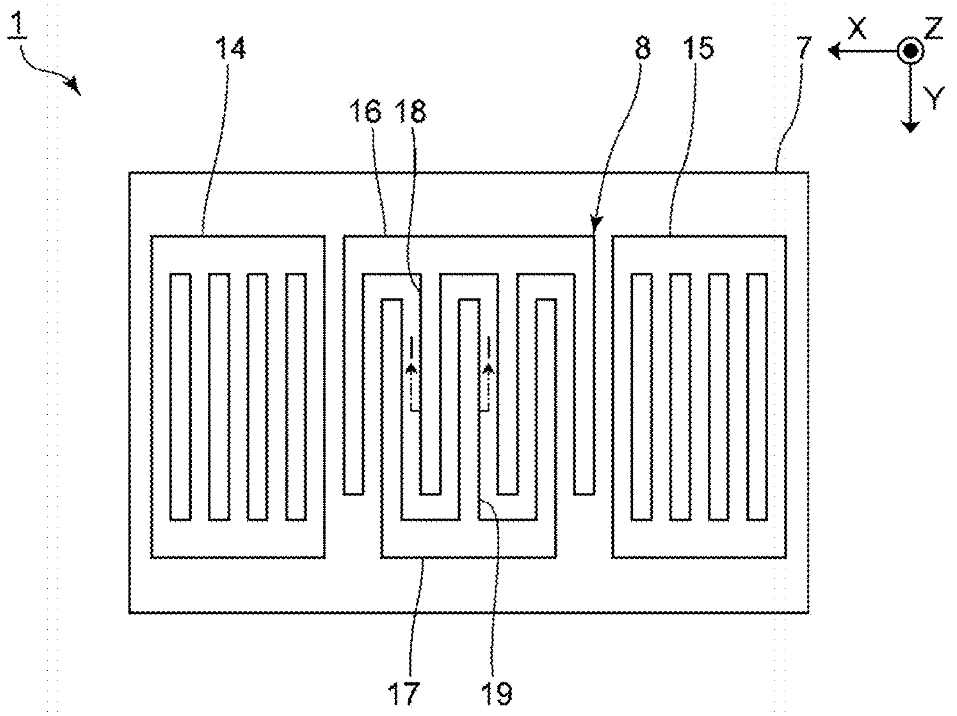
FIG. 2 is a plan view of the acoustic wave device according to the first preferred embodiment of the present invention.

FIG. 1 is an elevational cross-sectional view of a portion of an acoustic wave device according to a first preferred embodiment of the present invention. FIG. 2 is a plan view of the acoustic wave device according to the first preferred embodiment. FIG. 1 is a cross-sectional view taken along the line I-I in FIG. 2.

As shown in FIG. 1, the acoustic wave device 1 includes a multilayer substrate 9. The multilayer substrate 9 includes a silicon substrate 2, a polysilicon layer 3, a silicon oxide layer 5, and a piezoelectric layer 7. More specifically, the polysilicon layer 3 is provided on the silicon substrate 2. The silicon oxide layer 5 is provided on the polysilicon layer 3. The piezoelectric layer 7 is provided on the silicon oxide layer 5.

In the present preferred embodiment, the silicon substrate 2 is a silicon monocrystal substrate. The plane orientation of the silicon substrate 2 is (111). Of course, the plane orientation of the silicon substrate 2 may be any one of (100), (110), and (111).

Silicon oxides in the silicon oxide layer 5 are expressed by $SiO_x$. x is a positive number. In the present preferred embodiment, the silicon oxide layer 5 is an $SiO_2$ layer. Of course, x is not limited to two.

In the present preferred embodiment, the piezoelectric layer 7 is a lithium tantalate layer with a cut angle of 40°. Of course, the cut angle and material of the piezoelectric layer 7 are not limited thereto. For example, lithium niobate may be used as the material of the piezoelectric layer 7.

The interdigital transducer electrode 8 is provided on the piezoelectric layer 7. Acoustic waves are excited by applying an alternating-current voltage to the interdigital transducer electrode 8. As shown in FIG. 2, a reflector 14 and a reflector 15 are provided on the piezoelectric layer 7 respectively on both sides of the interdigital transducer electrode 8 in an acoustic wave propagation direction. In this way, the acoustic wave device 1 according to the present preferred embodiment is a surface acoustic wave resonator. Although not limited thereto, the acoustic wave device according to the present invention may be a filter device, a multiplexer, or the like, that includes a plurality of surface acoustic wave resonators.

As shown in FIG. 2, the interdigital transducer electrode 8 has a first busbar 16, a second busbar 17, a plurality of first electrode fingers 18, and a plurality of second electrode fingers 19. The first busbar 16 and the second busbar 17 are opposite to each other. One ends of the first electrode fingers 18 are connected to the first busbar 16. One ends of the second electrode fingers 19 are connected to the second busbar 17. The plurality of first electrode fingers 18 and the plurality of second electrode fingers 19 interdigitate with each other. In the specification, the acoustic wave propagation direction is assumed as an X direction. A direction in which the first electrode fingers 18 and the second electrode fingers 19 of the interdigital transducer electrode 8 extend is assumed as a Y direction. A thickness direction of each of the interdigital transducer electrode 8, the piezoelectric layer 7, the silicon substrate 2, and the like is assumed as a Z direction.

The interdigital transducer electrode 8 includes a multilayer metal film. More specifically, in the multilayer metal film, a Ti layer, an AlCu layer, and a Ti layer are laminated in this order. The reflector 14 and the reflector 15 are also made of a material similar to that of the interdigital transducer electrode 8. Of course, the materials of the interdigital transducer electrode 8, the reflector 14, and the reflector 15 are not limited thereto. Alternatively, the interdigital transducer electrode 8, the reflector 14, and the reflector 15 may be made up of a single-layer metal film.

Where a wave length that is defined by the electrode finger pitch of the interdigital transducer electrode 8 is A, the thickness of the piezoelectric layer 7 is less than or equal to about 1λ, for example. The electrode finger pitch is an electrode finger center-to-center distance between adjacent electrode fingers. The electrode finger pitch is, specifically, a distance connecting central points of adjacent electrode fingers in the acoustic wave propagation direction, that is, the X direction. When the electrode finger center-to-center distance is not constant, the electrode finger pitch is assumed as an average value of the electrode finger center-to-center distance.

A protective film may be provided on the piezoelectric layer 7 so as to cover the interdigital transducer electrode 8. In this case, the interdigital transducer electrode 8 is less likely to break. An appropriate dielectric may be used as the protective film. When, for example, a silicon oxide is used as the protective film, frequency-temperature characteristics (TCF) are increased. When a silicon nitride is used as the protective film, frequency is easily adjusted by adjusting the thickness of the protective film. Of course, the protective film does not need to be provided.

Some of the unique features of the present preferred embodiment are that, in the multilayer substrate 9, the silicon substrate 2, the polysilicon layer 3, the silicon oxide layer 5, and the piezoelectric layer 7 are laminated, and the thickness of the piezoelectric layer 7 is less than or equal to about 1λ, for example. Thus, higher-order modes are reduced in a wide band. The details of the advantageous effects will be described below together with the definition and the like of crystallographic axes and plane orientation.

Figure 3:
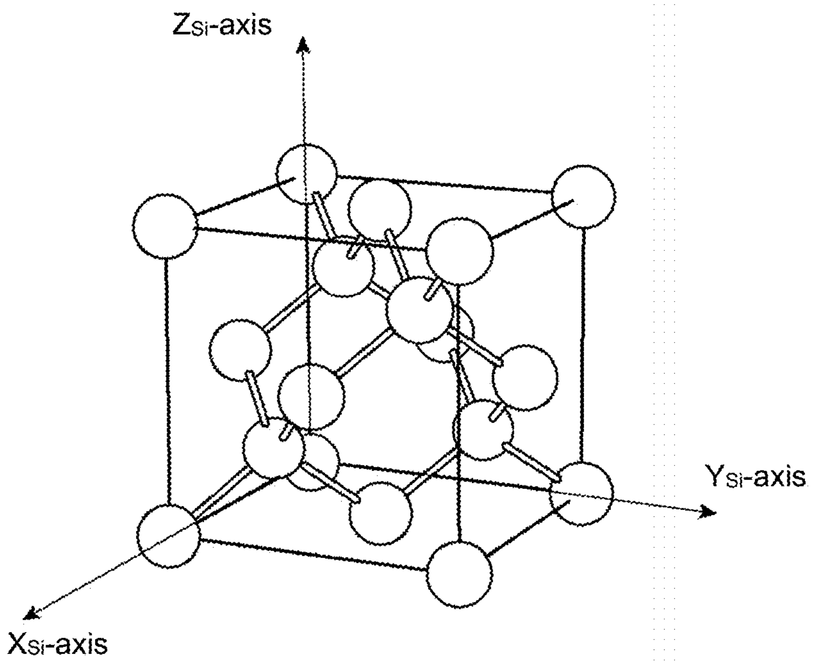
FIG. 3 is a schematic diagram that shows the definition of the crystallographic axes of silicon.
Figure 4:
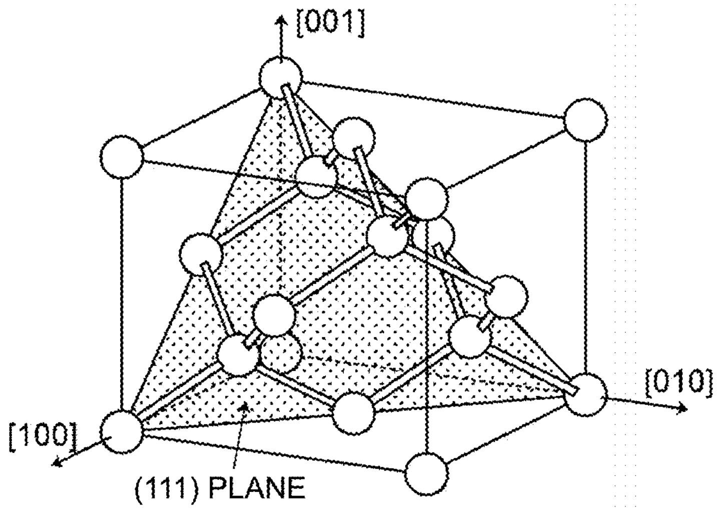
FIG. 4 is a schematic diagram that shows a (111) plane of silicon.
Figure 5:
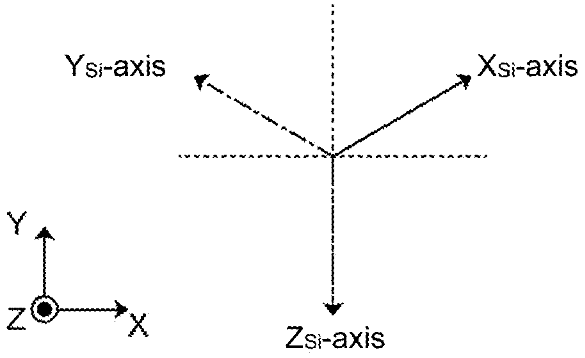
FIG. 5 is a diagram when the crystallographic axes of the (111) plane of silicon are viewed from an XY-plane in the first preferred embodiment of the present invention.
Figure 6:
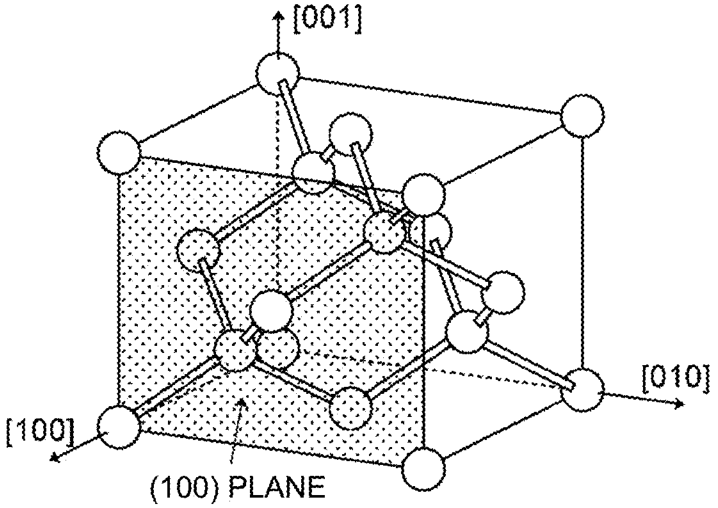
FIG. 6 is a schematic diagram that shows a (100) plane of silicon.
Figure 7:
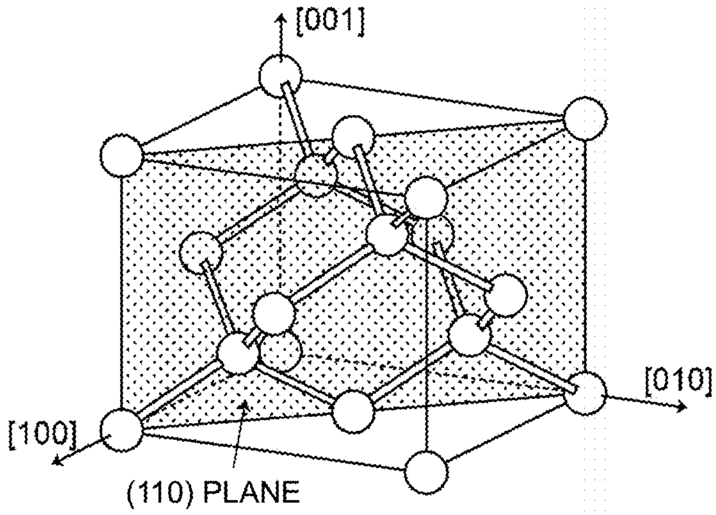
FIG. 7 is a schematic diagram that shows a (110) plane of silicon.

FIG. 3 is a schematic diagram that shows the definition of the crystallographic axes of silicon. FIG. 4 is a schematic diagram that shows a (111) plane of silicon. FIG. 5 is a diagram when the crystallographic axes of the (111) plane of silicon is viewed from an XY-plane in the first preferred embodiment. FIG. 6 is a schematic diagram that shows a (100) plane of silicon. FIG. 7 is a schematic diagram that shows a (110) plane of silicon.

As shown in FIG. 3, a silicon monocrystal has a diamond structure. In the specification, the crystallographic axes of silicon that is a component of the silicon substrate 2 are assumed as $[X_{Si}, Y_{Si}, Z_{Si}]$. As for silicon, an $X_{Si}$-axis, a $Y_{Si}$-axis, and a $Z_{Si}$-axis are equivalent to one another due to the symmetry of a crystal structure. As shown in FIG. 5, there is a three-fold symmetry in the (111) plane, and an equivalent crystal structure is obtained by 120° rotation.

As described above, the plane orientation of the silicon substrate 2 according to the present preferred embodiment is (111). The fact that the plane orientation is (111) means that a substrate or a layer is cut along the (111) plane orthogonal to the crystallographic axes represented by Miller indices [111] in the crystal structure of silicon having a diamond structure. The (111) plane is a plane shown in FIGS. 4 and 5. Of course, the (111) plane includes other crystallographically equivalent planes.

On one hand, the fact that the plane orientation is (100) means that a substrate or a layer is cut along the (100) plane orthogonal to the crystallographic axes represented by Miller indices [100] in the crystal structure of silicon having a diamond structure. There is a four-fold symmetry in the (100) plane, and an equivalent crystal structure is obtained by 90° rotation. The (100) plane is a plane shown in FIG. 6.

On the other hand, the fact that the plane orientation is (110) means that a substrate or a layer is cut along the (110) plane orthogonal to the crystallographic axes represented by Miller indices [110] in the crystal structure of silicon having a diamond structure. There is a two-fold symmetry in the (110) plane, and an equivalent crystal structure is obtained by 180° rotation. The (110) plane is a plane shown in FIG. 7.

Here, the present preferred embodiment and a first comparative example are compared with each other to demonstrate that higher-order modes are reduced in a wide band according to the present preferred embodiment. The first comparative example differs from the present preferred embodiment in that, in the multilayer substrate, a silicon nitride layer is laminated instead of the polysilicon layer.

Figure 8:
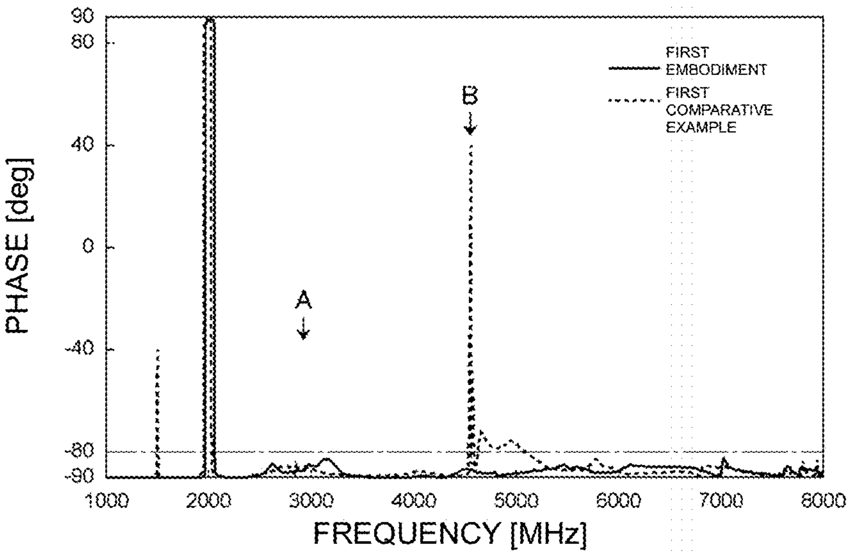
FIG. 8 is a graph that shows the phase characteristics of the acoustic wave device according to the first preferred embodiment of the present invention and the phase characteristics of an acoustic wave device according to a first comparative example.

FIG. 8 is a graph that shows the phase characteristics of the acoustic wave device according to the first preferred embodiment and the phase characteristics of an acoustic wave device according to the first comparative example.

As indicated by the arrow A in FIG. 8, in each of the first preferred embodiment and the first comparative example, a higher-order mode around 1.5 times the resonant frequency is reduced. However, in the first comparative example, it appears that, as indicated by the arrow B, a large spurious due to a higher-order mode is generated around 2.2 times the resonant frequency. In contrast, in the first preferred embodiment, it appears that a higher-order mode is effectively reduced around the frequency indicated by the arrow B. More specifically, in the first preferred embodiment, a higher-order mode is reduced to less than −80[deg.] at not only frequencies around 1.5 times the resonant frequency but also frequencies around 2.2 times the resonant frequency.

The reason will be described by using a first reference example and a second reference example. In the first reference example, a multilayer substrate is a multilayer body of a silicon substrate, a silicon oxide layer, and a piezoelectric layer. The plane orientation of the silicon substrate in the first reference example is (111). In the second reference example, a multilayer substrate is a multilayer body of a polysilicon substrate, a silicon oxide layer, and a piezoelectric layer. The piezoelectric layer according to the first reference example and the piezoelectric layer according to the second reference example are lithium tantalate layers.

Figure 9:
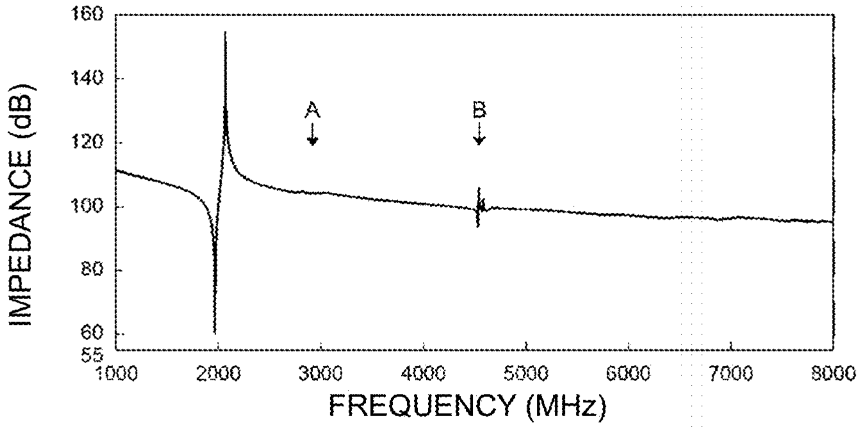
FIG. 9 is a graph that shows the impedance frequency characteristics of an acoustic wave device according to a first reference example.
Figure 10:
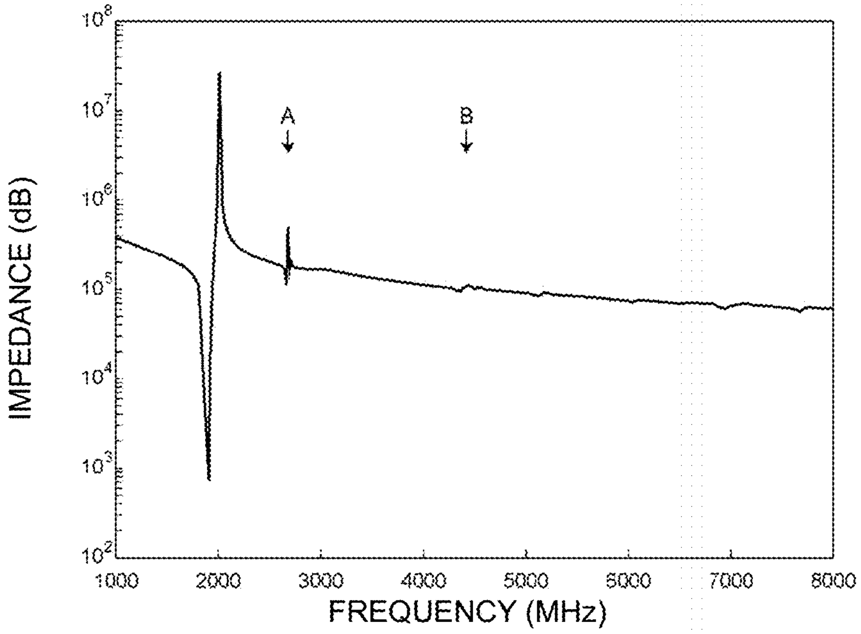
FIG. 10 is a graph that shows the impedance frequency characteristics of an acoustic wave device according to a second reference example.
Figure 11:
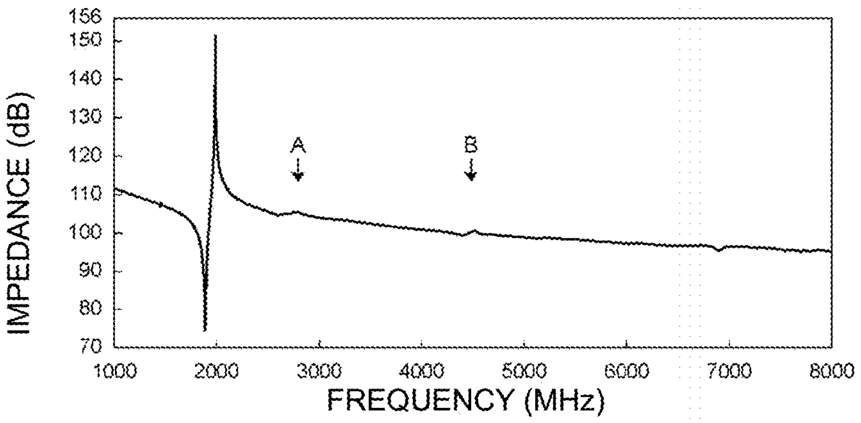
FIG. 11 is a graph that shows the impedance frequency characteristics of the acoustic wave device according to the first preferred embodiment of the present invention.

FIG. 9 is a graph that shows the impedance frequency characteristics of an acoustic wave device according to the first reference example. FIG. 10 is a graph that shows the impedance frequency characteristics of an acoustic wave device according to the second reference example. FIG. 11 is a graph that shows the impedance frequency characteristics of the acoustic wave device according to the first preferred embodiment.

As indicated by the arrow A in FIG. 9, a higher-order mode around 1.5 times the resonant frequency is reduced in the first reference example. This is due to the fact that the plane orientation of the silicon substrate is (111). However, as indicated by the arrow B, a higher-order mode around 2.2 times the resonant frequency is not sufficiently reduced in the first reference example.

On the other hand, as indicated by the arrow B in FIG. 10, a higher-order mode around 2.2 times the resonant frequency is reduced in the second reference example. This is due to the fact that the higher-order mode is made as a leaky mode because the polysilicon substrate is provided. However, as indicated by the arrow A, a higher-order mode around 1.5 times the resonant frequency is not sufficiently reduced.

In contrast, in the first preferred embodiment, the multilayer substrate 9 includes both the silicon substrate 2 and the polysilicon layer 3, and the plane orientation of the silicon substrate 2 is (111). In addition, the thickness of the piezoelectric layer 7 is less than or equal to about 1λ. With this configuration, as shown in FIG. 11, both a higher-order mode around 1.5 times the resonant frequency and a higher-order mode around 2.2 times the resonant frequency are effectively reduced. In this way, in the first preferred embodiment, higher-order modes are reduced in a wide band.

Incidentally, in the first preferred embodiment, the polysilicon layer 3 and the silicon oxide layer 5 are provided between the silicon substrate 2 and the piezoelectric layer 7. The inventor of the present application discovered that, even in such a case, higher-order modes were further reliably reduced by defining the relationship between the plane orientation of the silicon substrate 2 and the crystallographic axes of the piezoelectric layer 7. Here, a directional vector that is defined in accordance with the direction of crystallographic axes of the piezoelectric layer 7 is assumed as k. An angle that is defined in accordance with the relationship between the crystallographic axes of the piezoelectric layer 7 and the plane orientation of the silicon substrate 2 is assumed as α. The directional vector k is any one of three vectors $k_{111}$, $k_{110}$, and $k_{100}$. The angle α is any one of three angles $\alpha_{111}$, $\alpha_{110}$, and $\alpha_{100}$. $k_{111}$ and $\alpha_{111}$, $k_{110}$ and $\alpha_{110}$, and $k_{100}$ and $\alpha_{100}$ respectively correspond to the plane orientations (111), (110), and (100). Hereinafter, the details of the directional vector k and the angle α will be described.

Figure 12:
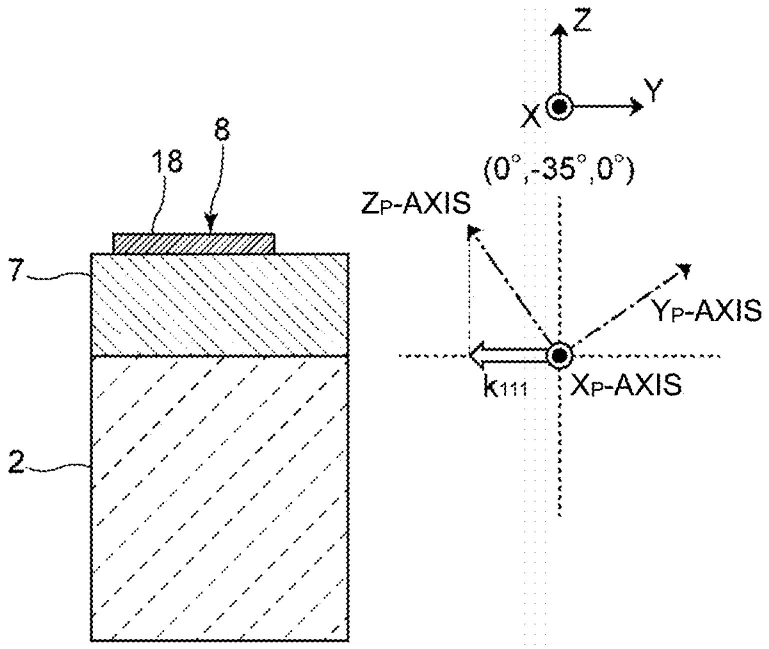
FIG. 12 is a schematic cross-sectional view for illustrating a directional vector $k_{111}$.
Figure 13:
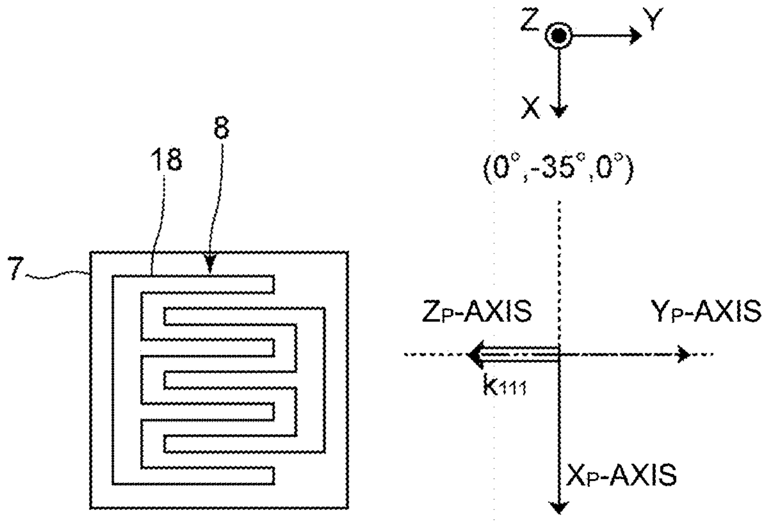
FIG. 13 is a schematic plan view for illustrating the directional vector $k_{111}$.

FIG. 12 is a schematic cross-sectional view for illustrating the directional vector kill. FIG. 13 is a schematic plan view for illustrating the directional vector kill. The plane orientation of the silicon substrate 2 in FIG. 12 is (111).

FIGS. 12 and 13 show an example of a case where the Euler angles of the piezoelectric layer 7 are (0°, −35°, 0°). The (111) plane of the silicon substrate 2 is in contact with the piezoelectric layer 7.

Here, as shown in FIG. 12, a directional vector obtained by projecting the $Z_P$-axis of a piezoelectric body $LiTaO_3$ that is a component of the piezoelectric layer 7 onto the (111) plane of the silicon substrate 2 is assumed as km. As shown in FIGS. 12 and 13, the directional vector km is parallel to the Y direction that is a direction in which the electrode fingers of the interdigital transducer electrode 8 extend.

Figure 14:
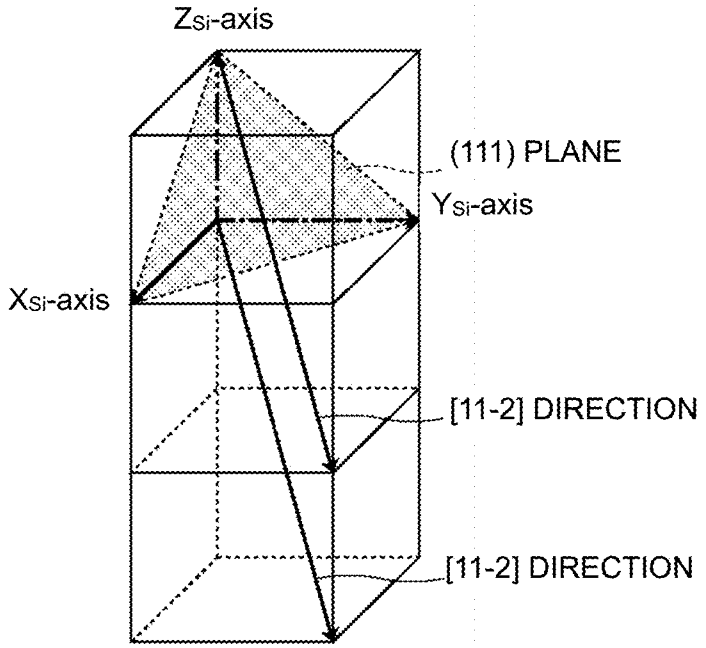
FIG. 14 is a schematic diagram that shows a [11-2] direction of silicon.
Figure 15:
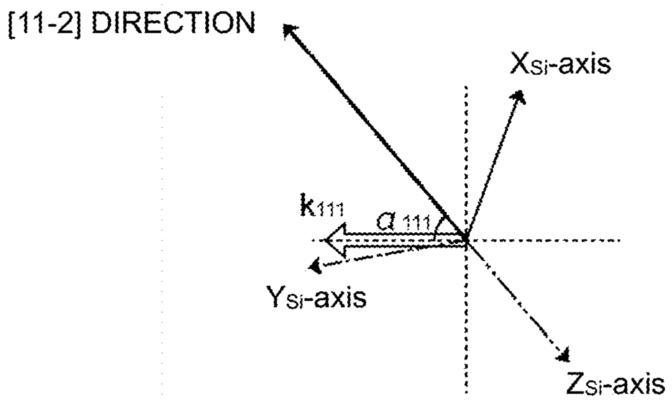
FIG. 15 is a schematic diagram for illustrating an angle $\alpha_{111}$.

FIG. 14 is a schematic diagram that shows a [11-2] direction of silicon. FIG. 15 is a schematic diagram for illustrating the angle $\alpha_{111}$.

As shown in FIG. 14, the [11-2] direction of silicon is represented as a resultant vector of a unit vector in an $X_{Si}$ direction, a unit vector in a $Y_{Si}$ direction, and a vector minus twice a unit vector in a $Z_{Si}$ direction in the crystal structure of silicon. As shown in FIG. 15, the angle $\alpha_{111}$ is an angle between the directional vector km and the [11-2] direction of silicon that is a component of the silicon substrate 2. As described above, from the symmetry of the crystal of silicon, the [11-2] direction, a [1-21] direction, and a [-211] direction are equivalent.

On one hand, in a silicon substrate of which the plane orientation is (110), a directional vector obtained by projecting the $Z_P$-axis onto the (110) plane of the silicon substrate is assumed as kilo. The angle $\alpha_{110}$ is an angle between the directional vector kilo and the [001] direction of silicon that is a component of the silicon substrate. From the symmetry of silicon, the [001] direction, a [100] direction, and a [010] direction are equivalent.

On the other hand, in a silicon substrate of which the plane orientation is (100), a directional vector obtained by projecting the $Z_P$-axis onto the (100) plane of the silicon substrate is assumed as $k_{100}$. The angle $\alpha_{100}$ is an angle between the directional vector $k_{100}$ and the [001] direction of silicon that is a component of the silicon substrate.

Regardless of whether the silicon substrate is laminated directly on the piezoelectric layer or laminated indirectly on the piezoelectric layer with another layer interposed therebetween, the definition of the directional vector k and the angle $\alpha$ is the same.

As described above, the plane orientation of the silicon substrate 2 is not limited to (111). The plane orientation of the silicon substrate 2 may be any one of (100), (110), and (111). The angle $\alpha$ is any one of three angles, that is, the angle $\alpha_{100}$, the angle $\alpha_{110}$, and the angle $\alpha_{111}$. More specifically, when the plane orientation of the silicon substrate 2 is (100), the angle $\alpha$ is the angle $\alpha_{100}$. When the plane orientation of the silicon substrate 2 is (110), the angle $\alpha$ is the angle $\alpha_{110}$. When the plane orientation of the silicon substrate 2 is (111), the angle $\alpha$ is the angle $\alpha_{111}$.

Here, an example of the phase characteristics of an acoustic wave device that has a similar configuration to the first preferred embodiment and in which the angle $\alpha_{111}$ is defined will be described. The design parameters of the acoustic wave device are as follows.

- Silicon Substrate 2: Material monocrystal silicon, Plane orientation (111), Euler angles ($\varphi$, $\theta$, $\psi$) (−45°, −54.7°, 60°), and Thickness 20 μm
- Polysilicon Layer 3: Material polysilicon, and Thickness 1 μm
- Silicon Oxide Layer 5: Material $SiO_2$, and Thickness 300 nm
- Piezoelectric Layer 7: Material $LiTaO_3$, Cut Angle 40° Y, Euler angles ($\varphi$, $\theta$, $\psi$) (0°, 130°, 0°), and Thickness 400 nm
- Layer Configuration of Interdigital Transducer Electrode 8: Material Ti, AlCu, and Ti from the piezoelectric layer 7 side, the content of Cu in AlCu is 1 wt %, and Thickness 12 nm, 100 nm, and 4 nm from the piezoelectric layer 7 side
- Duty Ratio of Interdigital Transducer Electrode 8: 0.5
- Wave Length $\lambda$ of Interdigital Transducer Electrode 8: 2 μm
- $\alpha_{111}$: 60°

Figure 16:
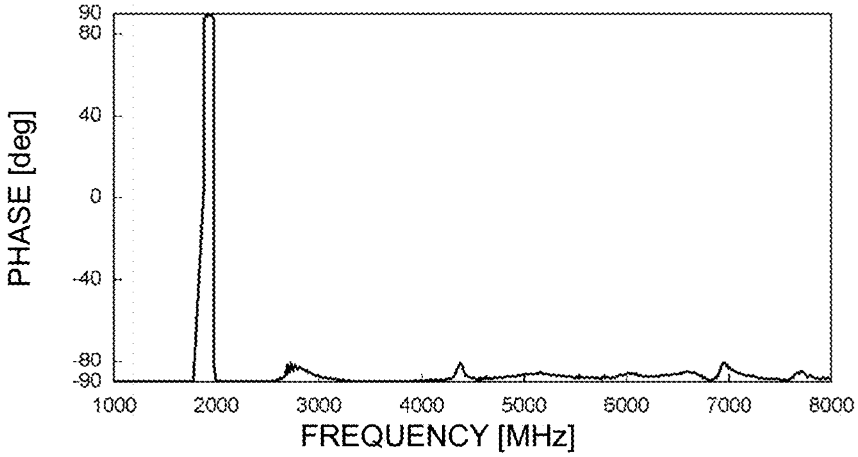
FIG. 16 is a graph that shows the phase characteristics of the acoustic wave device of which $\alpha_{111}$ is 60° in the first preferred embodiment of the present invention.

FIG. 16 is a graph that shows the phase characteristics of the acoustic wave device of which $\alpha_{111}$ is 60° in the first preferred embodiment.

As shown in FIG. 16, it appears that a higher-order mode is reduced to less than −80[deg.] at not only frequencies around 1.5 times the resonant frequency but also frequencies around 2.2 times the resonant frequency.

Incidentally, as shown in FIG. 1, in the present preferred embodiment, the silicon oxide layer 5 is provided directly on the polysilicon layer 3. The piezoelectric layer 7 is provided directly on the silicon oxide layer 5. Of course, the silicon oxide layer 5 may be provided indirectly on the polysilicon layer 3 with another layer interposed therebetween. Similarly, the piezoelectric layer 7 may be provided indirectly on the silicon oxide layer 5 with another layer interposed therebetween.

Figure 17:
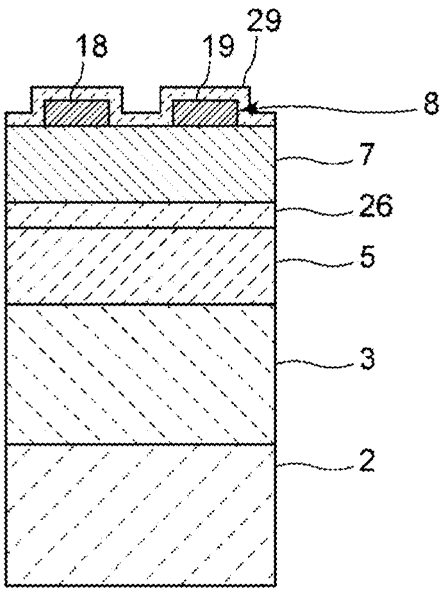
FIG. 17 is an elevational cross-sectional view around a pair of electrode fingers of an acoustic wave device according to a second preferred embodiment of the present invention.

FIG. 17 is an elevational cross-sectional view around a pair of electrode fingers of an acoustic wave device according to a second preferred embodiment.

The present preferred embodiment differs from the first preferred embodiment in that a silicon nitride layer 26 is provided between the silicon oxide layer 5 and the piezoelectric layer 7. The present preferred embodiment further differs from the first preferred embodiment in that a protective film 29 is provided on the piezoelectric layer 7 so as to cover the interdigital transducer electrode 8. Other than the above points, the acoustic wave device according to the present preferred embodiment has a similar configuration to the acoustic wave device 1 according to the first preferred embodiment.

Here, an example of the phase characteristics of an acoustic wave device that has a similar configuration to the present preferred embodiment and in which the angle $\alpha_{111}$ is defined will be described. The design parameters of the acoustic wave device are similar to those of the acoustic wave device according to the first preferred embodiment in which the phase characteristics shown in FIG. 16 are measured, except the following points.

- Polysilicon Layer 3: Material polysilicon, Thickness 1.3 μm
- Silicon Nitride Layer 26: Material SiN, and Thickness 50 nm
- Layer Configuration of Interdigital Transducer Electrode 8: Material Ti, AlCu, and Ti from the piezoelectric layer 7 side, the content of Cu in AlCu is 1 wt %, and Thickness 10 nm, 100 nm, and 4 nm from the piezoelectric layer 7 side
- Protective Film 29: Material $SiO_2$, and Thickness 30 nm
- $\alpha_{111}$: 60°

Figure 18:
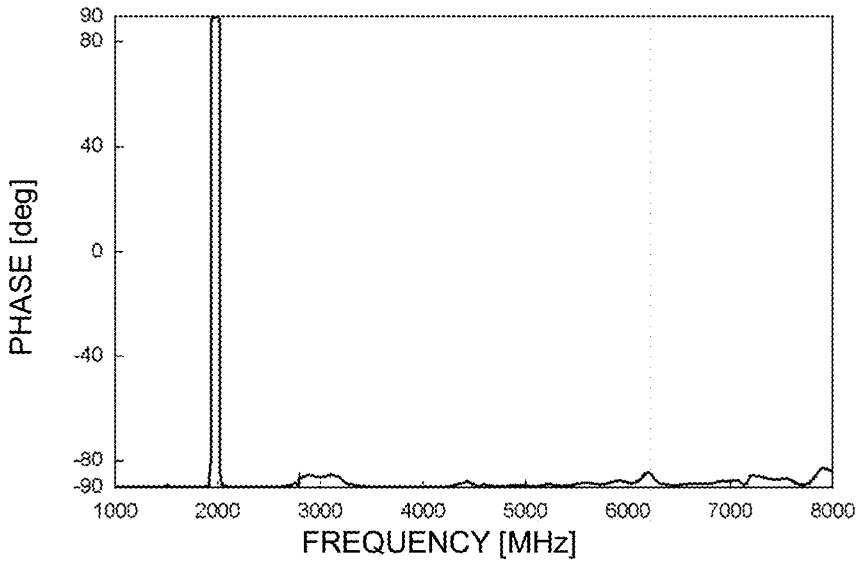
FIG. 18 is a graph that shows the phase characteristics of the acoustic wave device according to the second preferred embodiment of the present invention.

FIG. 18 is a graph that shows the phase characteristics of the acoustic wave device according to the second preferred embodiment.

As shown in FIG. 18, it appears that, in the present preferred embodiment, higher-order modes are reduced in a wide band.

Figure 19:
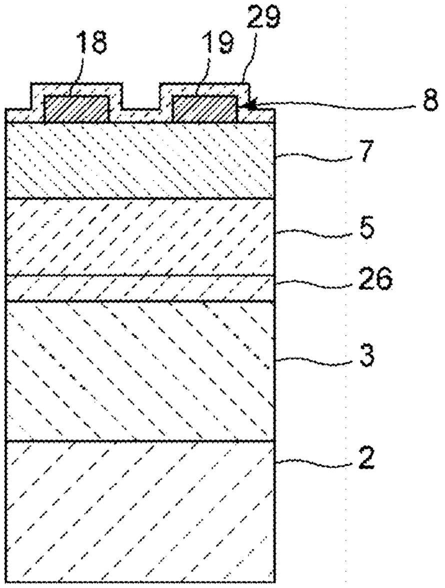
FIG. 19 is an elevational cross-sectional view around a pair of electrode fingers of an acoustic wave device according to a third preferred embodiment of the present invention.

FIG. 19 is an elevational cross-sectional view around a pair of electrode fingers of an acoustic wave device according to a third preferred embodiment.

The present preferred embodiment differs from the first preferred embodiment in that the silicon nitride layer 26 is provided between the polysilicon layer 3 and the silicon oxide layer 5. The present preferred embodiment further differs from the first preferred embodiment in that the protective film 29 is provided on the piezoelectric layer 7 so as to cover the interdigital transducer electrode 8. Other than the above points, the acoustic wave device according to the present preferred embodiment has a similar configuration to the acoustic wave device 1 according to the first preferred embodiment.

Here, an example of the phase characteristics of an acoustic wave device that has a similar configuration to the present preferred embodiment and in which the angle $\alpha_{111}$ is defined will be described. The design parameters of the acoustic wave device are similar to those of the acoustic wave device according to the first preferred embodiment in which the phase characteristics shown in FIG. 16 are measured, except the following points.

Silicon Nitride Layer 26: Material SiN, and Thickness 50 nm

Layer Configuration of Interdigital Transducer Electrode 8: Material Ti, AlCu, and Ti from the piezoelectric layer 7 side, the content of Cu in AlCu is 1 wt %, and Thickness 10 nm, 100 nm, and 4 nm from the piezoelectric layer 7 side Protective Film 29: Material $SiO_2$, and Thickness 30 nm $\alpha_{111}$: 60°

Figure 20:
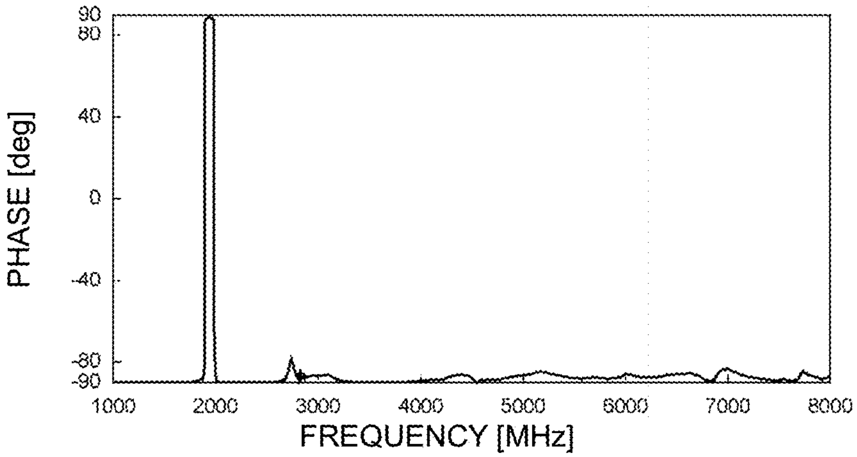
FIG. 20 is a graph that shows the phase characteristics of the acoustic wave device according to the third preferred embodiment of the present invention.

FIG. 20 is a graph that shows the phase characteristics of the acoustic wave device according to the third preferred embodiment.

As shown in FIG. 20, it appears that, in the present preferred embodiment, higher-order modes are reduced in a wide band. In addition, in the present preferred embodiment, as show in FIG. 19, the silicon nitride layer 26 is provided between the polysilicon layer 3 and the silicon oxide layer 5. With this configuration, generation of electric charge and electron transfer are reduced. Thus, degradation of IMD characteristics is reduced or prevented.

Figure 21:
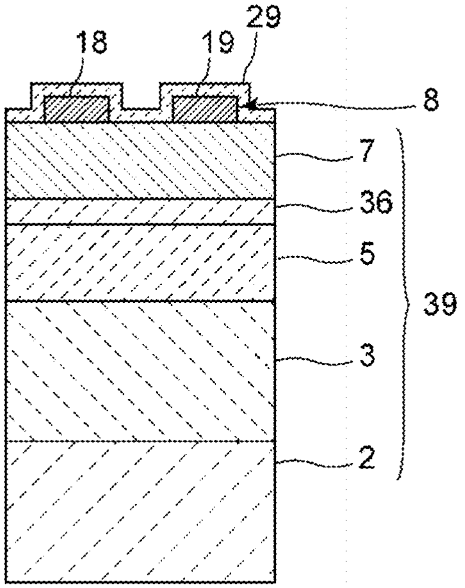
FIG. 21 is an elevational cross-sectional view around a pair of electrode fingers of an acoustic wave device according to a fourth preferred embodiment of the present invention.

FIG. 21 is an elevational cross-sectional view around a pair of electrode fingers of an acoustic wave device according to a fourth preferred embodiment.

The present preferred embodiment differs from the second preferred embodiment in that a titanium oxide layer 36 is provided between the silicon oxide layer 5 and the piezoelectric layer 7. A multilayer substrate 39 is a multilayer body of the silicon substrate 2, the polysilicon layer 3, the silicon oxide layer 5, the titanium oxide layer 36, and the piezoelectric layer 7. Other than the above points, the acoustic wave device according to the present preferred embodiment has a similar configuration to the acoustic wave device according to the second preferred embodiment.

Here, an example of the phase characteristics of an acoustic wave device that has a similar configuration to the present preferred embodiment and in which the angle $\alpha_{111}$ is defined will be described. The design parameters of the acoustic wave device are similar to those of the acoustic wave device according to the second preferred embodiment in which the phase characteristics shown in FIG. 18 are measured, except the following points.

Polysilicon Layer 3: Material polysilicon, and Thickness 1 μm

Titanium Oxide Layer 36: Material $TiO_2$, and Thickness 30 nm $\alpha_{111}$: 30°

Figure 22:
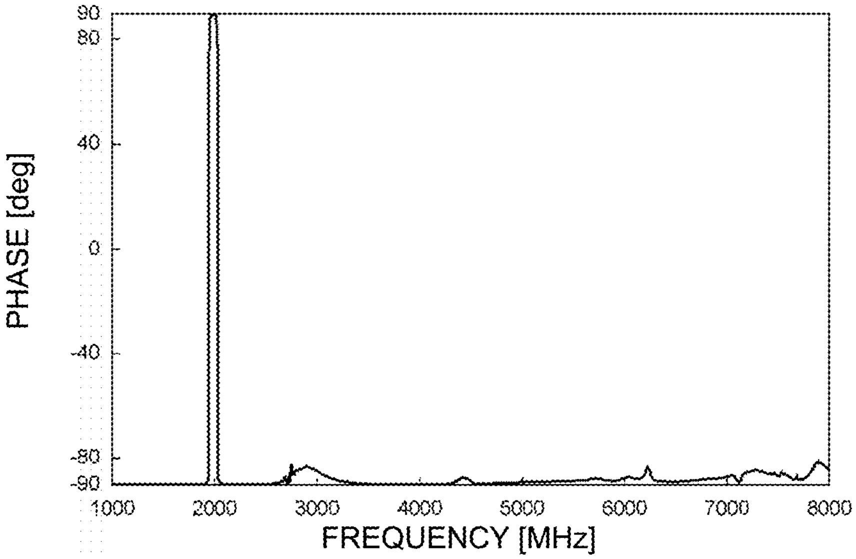
FIG. 22 is a graph that shows the phase characteristics of the acoustic wave device according to the fourth preferred embodiment of the present invention.

FIG. 22 is a graph that shows the phase characteristics of the acoustic wave device according to the fourth preferred embodiment.

As shown in FIG. 22, it appears that, in the present preferred embodiment, higher-order modes are reduced in a wide band. In addition, in the present preferred embodiment, as shown in FIG. 21, the titanium oxide layer 36 is provided between the silicon oxide layer 5 and the piezoelectric layer 7. Since the titanium oxide layer 36 has a large dielectric constant, a fractional band width is narrowed.

Here, in each of the acoustic wave devices respectively having the multilayer substrates according to the first, second, and fourth preferred embodiments, the phase of a higher-order mode was measured while the parameters such as the angle α were changed. Thus, conditions in which the phase of a higher-order mode was reduced to less than or equal to about −70[deg.] or less than or equal to about −80[deg.] were obtained. In each of the acoustic wave devices, the protective film 29 shown in FIG. 17 and the like is not provided. The conditions in which higher-order modes were reduced were obtained in each of a case where the plane orientation of the silicon substrate 2 was (100), a case where the plane orientation was (110), and a case where the plane orientation was (111). Hereinafter, the details will be described.

In the configuration of the first preferred embodiment shown in FIG. 1, the design parameters and the variable ranges of the design parameters were set as follows. The plane orientation of the silicon substrate 2 was set to (100).

Silicon Substrate 2: Material monocrystal silicon, Plane orientation (100), and Thickness 20 μm Polysilicon Layer 3: Material polysilicon, and Thickness changed in increments of 0.1 μm in the range greater than or equal to 0.1 μm and less than or equal to 1.5 μm.

Silicon Oxide Layer 5: Material $SiO_2$, and Thickness changed in increments of 0.05 μm in the range greater than or equal to 0.2 μm and less than or equal to 0.4 μm Piezoelectric Layer 7: Material $LiTaO_3$, Cut Angle 40° Y, Euler angles (φ, θ, ψ) (0°, 130°, 0°), and Thickness changed in increments of 0.1 μm in the range greater than or equal to 0.3 μm and less than or equal to 0.4 μm Layer Configuration of Interdigital Transducer Electrode 8: Material Ti, AlCu, and Ti from the piezoelectric layer 7 side, the content of Cu in AlCu is 1 wt %, and Thickness 12 nm, 100 nm, and 4 nm from the piezoelectric layer 7 side Duty Ratio of Interdigital Transducer Electrode 8: 0.5

Wave Length λ of Interdigital Transducer Electrode 8: 2 μm $\alpha_{100}$: changed in increments of 5° in the range greater than or equal to 0° and less than or equal to 45°

There is a four-fold symmetry in the (100) plane of a silicon substrate, and an equivalent crystal structure is obtained by 90° rotation. Thus, when the plane orientation of the silicon substrate 2 is (100), the angle $\alpha_{100}$ is set to $\alpha_{100}=\alpha_{100}+90\times n$. n is an integer (0, ±1, ±2, . . . ).

The phase of a higher-order mode was measured while the parameters were changed as described above. Thus, the equation 1 that was a relational expression between the parameters and the phase of a higher-order mode was derived. The angle α is assumed as Si_psi[deg.], the thickness of the piezoelectric layer 7 is assumed as t_LT[λ], the thickness of the silicon oxide layer 5 is assumed as $t\_SiO_2$[λ], the thickness of the polysilicon layer 3 is assumed as $t\_Si_2$[λ], and the phase of a higher-order mode is assumed as y[deg.]. In the equation 1, Si_psi[deg.] is the angle $\alpha_{100}$. In the equations in the specification, unit [deg.] represents the same meaning as unit [°].

$$y[\text{deg.}]=(-72.1492542241195)+0.627588217157224\times(Si\_psi[\text{deg}]-21.7083333333333)+(-1.93347870945237)\times(t\_Si_2[\lambda]-0.4525)+72.3846086764674\times(t\_LT[\lambda]-0.160833333333333)+(-67.3219584197057)\times(t\_SiO_2[\lambda]-0.16625)+0.0000655654050315201\times((Si\_psi[\text{deg.}]-21.7083333333333)\times(Si\_psi[\text{deg.}]-21.7083333333333)-25.2065972222222)+(-2.34857364418332)\times((Si\_psi[\text{deg.}]-21.7083333333333)\times((t\_Si_2[\lambda]-0.4525))+37.0048979126418\times((t\_Si_2[\lambda]-0.4525)\times((t\_Si_2[\lambda]-0.4525)-0.0360354166666667)+7.0771357128953\times((Si\_psi[\text{deg.}]-21.7083333333333)\times((t\_LT[\lambda]-0.160833333333333))+(-10.057857939681)\times((t\_Si_2[\lambda]-0.4525)\times(t\_LT[\lambda]-0.160833333333333))+1.5071677611893\times((Si\_psi[\text{deg.}]-21.7083333333333)\times(t\_SiO_2[\lambda]-0.16625))+426.86632497558\times(((t\_Si_2[\lambda]-0.4525)\times((t\_SiO_2[\lambda])-0.16625))+925.280868396996\times((t\_LT[\lambda]-0.160833333333333)\times(t\_SiO_2[\lambda]-0.16625))+988.798729044457\times((t\_SiO_2[\lambda]-0.16625)\times(t\_SiO_2[\lambda]-0.16625)-0.000871354166666668) \quad \text{Equation 1}$$

Si_psi[deg.], t_LT[λ], t_SiO$_2$[λ], and t_Si$_2$[λ] each are preferably a value within a range with which y in the equation 1 is less than or equal to about −70. With this configuration, the phase of a higher-order mode is further reliably set to less than or equal to about −70 [deg.]. Therefore, higher-order modes are further reliably and effectively reduced.

In the configuration of the first preferred embodiment, the plane orientation of the silicon substrate 2 was set to (110), and the phase of a higher-order mode was measured while the parameters were changed. The design parameters and the variable ranges of the design parameters were similar to those when the equation 1 was derived except the angle α.

$\alpha_{110}$: changed in increments of 10° in the range greater than or equal to 0° and less than or equal to 90°

There is a two-fold symmetry in the (110) plane of a silicon substrate, and an equivalent crystal structure is obtained by 180° rotation. Thus, when the plane orientation of the silicon substrate 2 is (110), the angle $\alpha_{110}$ is set to $\alpha_{110}=\alpha_{110}+180\times n$. n is an integer (0, ±1, 2, . . . ).

The phase of a higher-order mode was measured while the parameters were changed as described above. Thus, the equation 2 that was a relational expression between the parameters and the phase of a higher-order mode was derived. In the equation 2, Si_psi[deg.] is the angle $\alpha_{110}$.

$$
\begin{aligned}
y[\text{deg.}]=&(78.1876454049157)+(-0.182894322081067)\times(\mathit{Si\_psi}[\text{deg.}]-28.1088082901554)+6.18390256271178\times(\mathit{t\_Si}_2[\lambda]-0.39961139896373)\\
&+116.669335737855\times(\mathit{t\_LT}[\lambda]-0.169948186528498)+10.3573467893808\times(\mathit{t\_SiO}_2[\lambda]-0.144041450777202)\\
&+0.0110735958981267\times((\mathit{Si\_psi}[\text{deg.}]-28.1088082901554)\times(\mathit{Si\_psi}[\text{deg.}]-28.1088082901554)-189.946709978791)\\
&+(-0.246858144090431)\times((\mathit{Si\_psi}[\text{deg.}]-28.1088082901554)\times(\mathit{t\_Si}_2[\lambda]-0.39961139896373)\\
&+22.031016276383\times((\mathit{t\_Si}_2[\lambda]-0.39961139896373)\times(\mathit{t\_Si}_2[\lambda]-0.39961139896373)-0.0484389681602191)\\
&+(-X.0545756011518778)\times((\mathit{Si\_psi}[\text{deg.}]-28.1088082901554)\times(\mathit{t\_LT}[\lambda]-0.169948186528498))\\
&+(-32.427969747408)\times((\mathit{t\_Si}_2[\lambda]-0.39961139896373)\times((\mathit{t\_LT}[\lambda]-0.169948186528498))\\
&+(-2.62164982026802)\times((\mathit{Si\_psi}[\text{deg.}]-28.1088082901554)\times(\mathit{t\_SiO}_2[\lambda]-0.144041450777202))\\
&+(-112.759047075747)\times((\mathit{t\_Si}_2[\lambda]-0.39961139896373)\times((\mathit{t\_SiO}_2[\lambda]-0.144041450777202))\\
&+(-604.832727678973)\times((\mathit{t\_LT}[\lambda]-0.169948186528498)\times((\mathit{t\_SiO}_2[\lambda]-0.144041450777202))\\
&+326.415587634024\times((\mathit{t\_SiO}_2[\lambda]-0.144041450777202)\times((\mathit{t\_SiO}_2[\lambda]-0.144041450777202)-0.00120154232328385)
\end{aligned}
\quad\text{Equation 2}
$$

Si_psi[deg.], t_LT[λ], t_SiO$_2$[λ], and t_Si$_2$[λ] each are preferably a value within a range with which y in the equation 2 is less than or equal to about −70. With this configuration, the phase of a higher-order mode is further reliably set to less than or equal to about −70 [deg.]. Therefore, higher-order modes are further reliably and effectively reduced.

In the configuration of the first preferred embodiment, the plane orientation of the silicon substrate 2 was set to (111), and the phase of a higher-order mode was measured while the parameters were changed. The design parameters and the variable ranges of the design parameters were similar to those when the equation 1 was derived except the angle α.

$\alpha_{111}$: changed in increments of 5° in the range greater than or equal to 0° and less than or equal to 60°

There is a three-fold symmetry in the (111) plane of a silicon substrate, and an equivalent crystal structure is obtained by 120° rotation. Thus, when the plane orientation of the silicon substrate 2 is (111), the angle $\alpha_{111}$ is set to $\alpha_{111}=\alpha_{111}+120\times n$. n is an integer (0, ±1, 2, . . . ).

The phase of a higher-order mode was measured while the parameters were changed as described above. Thus, the equation 3 that was a relational expression between the parameters and the phase of a higher-order mode was derived. In the equation 3, Si_psi[deg.] is the angle $\alpha_{111}$.

$$
\begin{aligned}
y[\text{deg.}]=&(77.9109394183719)+(-0.0492368384201428)\times(\mathit{Si\_psi}[\text{deg.}]-45.2068126520681)+0.525124426223863\times(\mathit{t\_Si}_2[\lambda]-0.426216545012165)\\
&+117.400884406373\times(\mathit{t\_LT}[\lambda]-0.174330900243311)+(-2.62484877324049)\times(\mathit{t\_SiO}_2[\lambda]-0.15139902676399)\\
&+0.00307563131201403\times((\mathit{Si\_psi}[\text{deg.}]-45.2068126520681)\times(\mathit{Si\_psi}[\text{deg.}]-45.2068126520681)-182.925598356629)\\
&+(-0.0261801752592506)\times((\mathit{Si\_psi}[\text{deg.}]-45.2068126520681)\times(\mathit{t\_Si}_2[\lambda]-0.426216545012165))\\
&+23.8987529211434\times((\mathit{t\_Si}_2[\lambda]-0.426216545012165)\times(\mathit{t\_Si}_2[\lambda]-0.426216545012165)-0.0481296027432942)\\
&+1.52616542281399\times((\mathit{Si\_psi}[\text{deg.}]-45.2068126520681))\times(\mathit{t\_LT}[\lambda]-0.174330900243311))\\
&+(-129.002027283367)\times((\mathit{t\_Si}_2[\lambda]-0.426216545012165)\times((\mathit{t\_LT}[\lambda]-0.174330900243311))\\
&+(-1.22761778451819)\times((\mathit{Si\_psi}[\text{deg.}]-45.2068126520681)\times((\mathit{t\_SiO}_2[\lambda]-0.15139902676399))\\
&+(-42.6041784800926)\times((\mathit{t\_Si}_2[\lambda]-0.426216545012165)\times(\mathit{t\_SiO}_2[\lambda]-0.15139902676399))\\
&+(-468.84116493048)\times((\mathit{t\_LT}[\lambda]-0.174330900243311)\times(\mathit{t\_SiO}_2[\lambda]-0.15139902676399))\\
&+(-8.20635607220859)\times((\mathit{t\_SiO}_2[\lambda]-0.15139902676399)\times(\mathit{t\_SiO}_2[\lambda]-0.15139902676399)-0.0012830183932134)
\end{aligned}
\quad\text{Equation 3}
$$

Si_psi[deg.], t_LT[λ], t_SiO$_2$[λ], and t_Si$_2$[λ] each are preferably a value within a range with which y in the equation 3 is less than or equal to about −70. With this configuration, the phase of a higher-order mode is further reliably set to less than or equal to about −70 [deg.]. Therefore, higher-order modes are further reliably and effectively reduced.

In addition, conditions in which the phase of a higher-order mode was reduced to less than or equal to about −80[deg.] were obtained in each of a case where the plane orientation of the silicon substrate 2 was (100), a case where the plane orientation of the silicon substrate 2 was (110), and a case where the plane orientation of the silicon substrate 2 was (111). In these cases, the relational expression between the parameters and a higher-order mode differs from the equation 1, the equation 2, or the equation 3. More specifically, to obtain the conditions, an equation 4, an equation 5, and an equation 6 were derived while the parameters were changed within the range in which the phase of a higher-order mode was greater than or equal to −90[deg.] and less than or equal to about −70[deg.].

When the plane orientation of the silicon substrate 2 is (100), the equation 4 was derived as described above.

$$
\begin{aligned}
y[\text{deg.}]=&(-75.3156232479379)+0.63547968892276\times(\mathit{Si\_psi}[\text{deg}]-20.9090909090909)+(-2.02838142816204)\times(\mathit{t\_Si}_2[\lambda]-0.439772727272727)\\
&+90.1874317877843\times(\mathit{t\_LT}[\lambda]-0.151136363636364)+(-71.2997621594781)\times(\mathit{t\_SiO}_2[\lambda]-0.171590909090909)\\
&+0.108397383766316\times((\mathit{Si\_psi}[\text{deg.}]-20.9090909090909)\times(\mathit{Si\_psi}[\text{deg.}]-20.9090909090909)-13.9462809917355)\\
&+(-3.76982864951476)\times((\mathit{Si\_psi}[\text{deg.}]-20.9090909090909)\times(\mathit{t\_Si}_2[\lambda]-0.439772727272727))\\
&+37.3378798744213\times((\mathit{t\_Si}_2[\lambda]-0.439772727272727)\times(\mathit{t\_Si}_2[\lambda]-0.439772727272727)-0.0358613119834711)\\
&+(-23.7942425679855)\times((\mathit{Si\_psi}[\text{deg.}]-20.9090909090909)\times(\mathit{t\_SiO}_2[\lambda]-0.171590909090909))+462.018905986831\times
\end{aligned}
$$

$$((t\_Si_2[\lambda])-0.439772727272727)\times(t\_SiO_2[\lambda]-0.171590909090909))+1223.13016730739\times(((t\_SiO_2[\lambda]-0.171590909090909)\times(t\_SiO_2[\lambda]-0.171590909090909)-0.000641787190082645) \qquad \text{Equation 4}$$

Si_psi[deg.], t_LT[λ], $t\_SiO_2[\lambda]$, and $t\_Si_2[\lambda]$ each are preferably a value within a range with which y in the equation 4 is less than or equal to about −80. With this configuration, the phase of a higher-order mode is further reliably set to less than or equal to about −80[deg.]. Therefore, higher-order modes are further reliably and further reduced.

When the plane orientation of the silicon substrate 2 is (110), the equation 5 was derived as described above.

$$y[\text{deg.}]=(81.4138269086073)+(-0.100532115186538)\times(Si\_psi[\text{deg.}]-29.1379310344828)+0.845708574223377\times(t\_Si_2[\lambda]-0.385689655172414)+87.6682874459356\times(t\_LT[\lambda]-0.166724137931034)+(-0.137780433371857)\times(t\_SiO_2[\lambda]-0.145)+0.00337749443465239\times((Si\_psi[\text{deg.}]-29.1379310344828)\times(Si\_psi[\text{deg.}]-29.1379310344828)-127.877526753864)+(-0.116548121456389)\times((Si\_psi[\text{deg.}]-29.1379310344828)\times(t\_Si_2[\lambda]-0.385689655172414))+11.8893452691356\times((t\_Si_2[\lambda]-0.385689655172414)\times(t\_Si_2[\lambda]-0.385689655172414)-0.0448900416171225)+0.333200244545922\times((Si\_psi[\text{deg.}]-29.1379310344828)\times(t\_LT[\lambda]-0.166724137931034))+55.2630600466406\times((t\_Si_2[\lambda]-0.385689655172414)\times(t\_LT[\lambda]-0.166724137931034))+(-0.296582437395607)\times((Si\_psi[\text{deg.}]-29.1379310344828)\times(t\_SiO_2[\lambda]-0.145))+(-67.4578937630203)\times((t\_Si_2[\lambda]-0.385689655172414)\times(t\_SiO_2[\lambda]-0.145))+(-376.292315976729)\times((t\_LT[\lambda])-0.166724137931034)\times(t\_SiO_2[\lambda]-0.145))+48.6290874437329\times((t\_SiO_2[\lambda]-0.145)\times((t\_SiO_2[\lambda]-0.145)-0.00120775862068966) \qquad \text{Equation 5}$$

Si_psi[deg.], t_LT[λ], $t\_SiO_2[\lambda]$, and $t\_Si_2[\lambda]$ each are preferably a value within a range with which y in the equation 5 is less than or equal to about −80. With this configuration, the phase of a higher-order mode is further reliably set to less than or equal to about −80[deg.]. Therefore, higher-order modes are further reliably and further reduced.

When the plane orientation of the silicon substrate 2 is (111), the equation 6 was derived as described above.

$$y[\text{deg.}]=(-79.8924944284088)+0.033261334588906\times(Si\_psi[\text{deg.}]-39.3173431734317)+3.93783296791666\times(t\_Si_2[\lambda]-0.416974169741698)+80.6680077909648\times(t\_LT[\lambda]-0.17140221402214)+13.2276438709535\times(t\_SiO_2[\lambda]-0.148431734317343)+(-0.00907764275073328)\times((Si\_psi[\text{deg.}]-39.3173431734317)\times(Si\_psi[\text{deg.}]-39.3173431734317)-21.2129464468077)+0.000540095694459618\times((Si\_psi[\text{deg.}]-39.3173431734317)\times(t\_Si_2[\lambda]-0.416974169741698))+5.79698263968963\times((t\_Si_2[\lambda]-0.416974169741698)\times(t\_Si_2[\lambda]-0.416974169741698)-0.0400439808826132)+(-0.136650035849863)\times((Si\_psi[\text{deg.}]-39.3173431734317)\times(t\_LT[\lambda]-0.17140221402214))+(-20.3328823416631)\times((t\_Si_2[\lambda]-0.416974169741698)\times(t\_LT[\lambda]-0.17140221402214))+(-2.22480760136672)\times((Si\_psi[\text{deg.}]-39.3173431734317)\times(t\_SiO_2[\lambda]-0.148431734317343))+(-13.0975601885972)\times((t\_Si_2[\lambda]-0.416974169741698)\times(t\_SiO_2[\lambda]-0.148431734317343))+(-511.743077543129)\times((t\_LT[\lambda]-0.17140221402214)\times(t\_SiO_2[\lambda]-0.148431734317343))+137.213612130809\times((t\_SiO_2[\lambda]-0.148431734317343)\times(t\_SiO_2[\lambda]-0.148431734317343)-0.00135593537669694) \qquad \text{Equation 6}$$

Si_psi[deg.], t_LT[λ], $t\_SiO_2[\lambda]$, and $t\_Si_2[\lambda]$ each are preferably a value within a range with which y in the equation 6 is less than or equal to about −80. With this configuration, the phase of a higher-order mode is further reliably set to less than or equal to about −80[deg.]. Therefore, higher-order modes are further reliably and further reduced.

Subsequently, in the configuration having a multilayer substrate similar to that of the second preferred embodiment shown in FIG. 17, the design parameters and the variable ranges of the design parameters were set as follows. The plane orientation of the silicon substrate 2 was set to (100).

Silicon Substrate 2: Material monocrystal silicon, Plane orientation (100), and Thickness 20 μm Polysilicon Layer 3: Material polysilicon, and Thickness changed in increments of 0.1 μm in the range greater than or equal to 0.1 μm and less than or equal to 1.5 μm.

Silicon Oxide Layer 5: Material $SiO_2$, and Thickness changed in increments of 0.05 μm in the range greater than or equal to 0.2 μm and less than or equal to 0.4 μm Silicon Nitride Layer 26: Material SiN, Thickness changed in increments of 0.02 μm in the range greater than or equal to 0.01 μm and less than or equal to 0.15 μm.

Piezoelectric Layer 7: Material $LiTaO_3$, Cut Angle 40° Y, Euler angles (φ, θ, ψ) (0°, 130°, 0°), and Thickness changed in increments of 0.1 μm in the range greater than or equal to 0.3 μm and less than or equal to 0.4 μm Layer Configuration of Interdigital Transducer Electrode 8: Material Ti, AlCu, and Ti from the piezoelectric layer 7 side, the content of Cu in AlCu is 1 wt %, and Thickness 12 nm, 100 nm, and 4 nm from the piezoelectric layer 7 side Duty Ratio of Interdigital Transducer Electrode 8: 0.5

Wave Length λ of Interdigital Transducer Electrode 8: 2 μm $\alpha_{100}$: changed in increments of 5° in the range greater than or equal to 0° and less than or equal to 450

The phase of a higher-order mode was measured while the parameters were changed as described above. Thus, an equation 7 that was a relational expression between the parameters and the phase of a higher-order mode was derived. The thickness of the silicon nitride layer 26 is set to t_SiN[λ]. In the equation 7, Si_psi[deg.] is the angle $\alpha_{100}$.

$$y[\text{deg.}]=(-67.7782730918073)+0.0667732718475358\times(Si\_psi[\text{deg.}]-25.6259314456036)+(-6.71256568714434)\times(t\_Si_2[\lambda]-0.426192250372578)+177.355083873051\times(t\_LT[\lambda]-0.16602086438151)+(-64.7093491078986)\times(t\_SiN[\lambda]-0.0465201192250378)+1.0890884781807\times(t\_SiO_2[\lambda]-0.155793591654245)+0.000179985859065592\times(Si\_psi[\text{deg.}]-25.6259314456036)\times(Si\_psi[\text{deg.}]-25.6259314456036)-130.38317256758)+(-0.329348427439478)\times((Si\_psi[\text{deg.}]-25.6259314456036)\times(t\_Si_2[\lambda]-0.426192250372578))+(-33.1084698932093)\times((t\_Si_2[\lambda]-0.426192250372578)\times(t\_Si_2[\lambda]-0.426192250372578)-0.0504801359160987)+1.52146775761601\times((Si\_psi[\text{deg.}]-25.6259314456036)\times(t\_LT[\lambda]-0.16602086438151))+14.5974162574468\times((t\_Si_2[\lambda]-0.426192250372578)\times(t\_LT[\lambda]-0.16602086438151))+0\times((t\_LT[\lambda]-0.16602086438151)\times(t\_LT[\lambda]-0.16602086438151)-0.000544375123544922)+(-4.94058423048505)\times((Si\_psi[\text{deg.}]-25.6259314456036)\times((t\_SiN[\lambda]-0.0465201192250378))+138.799085167873\times((t\_Si_2[\lambda]-0.426192250372578)\times(t\_SiN[\lambda]-0.0465201192250378))+1746.7447498235\times$$

$$\begin{aligned}&((t\_LT[\lambda]-0.16602086438151)\times(t\_SiN[\lambda]-\\&0.0465201192250378))+2167.04168685901\times\\&((t\_SiN[\lambda]-0.0465201192250378)\times(t\_SiN[\lambda]-\\&0.0465201192250378)-\\&0.000465274930537198)+(-\\&0.931372972560935)\times((Si\_psi[deg.]-\\&25.6259314456036)\times(t\_SiO_2[\lambda]-\\&0.155793591654245))+(-79.4377446578721)\times\\&((t\_Si_2[\lambda]-0.426192250372578)\times(t\_SiO_2[\lambda]-\\&0.155793591654245))+(-86.9697272546991)\times\\&((t\_LT[\lambda]-0.16602086438151)\times(t\_SiO_2[\lambda]-\\&0.155793591654245))+1966.46522796354\times\\&((t\_SiN[\lambda]-0.0465201192250378)\times(t\_SiO_2[\lambda]-\\&0.155793591654245))+169.040605778099\times\\&((t\_SiO_2[\lambda]-0.155793591654245)\times(t\_SiO_2[\lambda]-\\&0.155793591654245)-0.00164210493657841)\end{aligned}\qquad\text{Equation 7}$$

Si_psi[deg.], t_LT[λ], $t\_SiO_2[\lambda]$, t_SiN[λ], and $t\_Si_2[\lambda]$ each are preferably a value within a range with which y in the equation 7 is less than or equal to about −70. With this configuration, the phase of a higher-order mode is further reliably set to less than or equal to about −70[deg.]. Therefore, higher-order modes are further reliably and effectively reduced.

In the configuration having a multilayer substrate similar to that of the second preferred embodiment, the plane orientation of the silicon substrate 2 was set to (110), and the phase of a higher-order mode was measured while the parameters were changed. The design parameters and the variable ranges of the design parameters were similar to those when the equation 7 was derived except the angle α.

$\alpha_{110}$: changed in increments of 10° in the range greater than or equal to 0° and less than or equal to 90°

The phase of a higher-order mode was measured while the parameters were changed as described above. Thus, an equation 8 that was a relational expression between the parameters and the phase of a higher-order mode was derived. In the equation 8, Si_psi[deg.] is the angle $\alpha_{110}$.

$$\begin{aligned}y[deg.]=&(-75.0174122935603)+(-\\&0.00810936153116664)\times(Si\_psi[deg.]-\\&42.0340722495895)+1.98135617767495\times(t\_Si_2\\&[\lambda]-0.385026683087027)+143.173790020328\times\\&(t\_LT[\lambda]-0.17306034482757)+\\&16.4148627328736\times(t\_SiN[\lambda]-\\&0.04207922824302)+50.4122771861205\times\\&(t\_SiO_2[\lambda])-0.144909688013139)+\\&0.00619821963137332\times((Si\_psi[deg.]-\\&42.0340722495895)\times(Si\_psi[deg.]-\\&42.0340722495895)-514.232829229589)+\\&0.020323078287526\times((Si\_psi[deg.]-\\&42.0340722495895)\times(t\_Si_2[\lambda]-\\&0.385026683087027))+1.15443318031007\times\\&((t\_Si_2[\lambda]-0.385026683087027)\times(t\_Si_2[\lambda]-\\&0.385026683087027)-0.0477966331139576)+\\&0.472662465737381\times((Si\_psi[deg.]-\\&42.0340722495895)\times(t\_LT[\lambda]-\\&0.17306034482757))+(-105.2996012677)\times\\&((t\_Si_2[\lambda]-0.385026683087027)\times(t\_LT[\lambda]-\\&0.17306034482757))+(-1.29517116632701)\times\\&((Si\_psi[deg.]-42.0340722495895)\times(t\_SiN[\lambda]-\\&0.04207922824302))+(-26.1801037669841)\times\\&((t\_Si_2[\lambda]-0.385026683087027)\times(t\_SiN[\lambda])-\\&0.04207922824302))+168.1334353773\times((t\_LT\\&[\lambda]-0.17306034482757)\times(t\_SiN[\lambda]-\\&0.04207922824302))+2120.76431830662\times\\&((t\_SiN[\lambda]-0.04207922824302)\times(t\_SiN[\lambda]-\\&0.04207922824302)-0.000508197335364991)+\\&(-0.687562974959064)\times((Si\_psi[deg.]-\\&42.0340722495895)\times(t\_SiO_2[\lambda]-\\&0.144909688013139))+15.3482271106745\times\\&((t\_Si_2[\lambda]-0.385026683087027)\times(t\_SiO_2[\lambda]-\\&0.144909688013139))+(-358.720795782422)\times\\&((t\_LT[\lambda]-0.17306034482757)\times(t\_SiO_2[\lambda]-\\&0.144909688013139))+1062.30534015379\times\\&((t\_SiN[\lambda]-0.04207922824302)\times(t\_SiO_2[\lambda]-\\&0.144909688013139))+248.937429294479\times\\&((t\_SiO_2[\lambda]-0.144909688013139)\times(t\_SiO_2[\lambda]-\\&0.144909688013139)-0.00162330875671721)\end{aligned}\qquad\text{Equation 8}$$

Si_psi[deg.], t_LT[λ], $t\_SiO_2[\lambda]$, t_SiN[λ], and $t\_Si_2[\lambda]$ each are preferably a value within a range with which y in the equation 8 is less than or equal to about −70. With this configuration, the phase of a higher-order mode is further reliably set to less than or equal to about −70[deg.]. Therefore, higher-order modes are further reliably and effectively reduced.

In the configuration having a multilayer substrate similar to that of the second preferred embodiment, the plane orientation of the silicon substrate 2 was set to (111), and the phase of a higher-order mode was measured while the parameters were changed. The design parameters and the variable ranges of the design parameters were similar to those when the equation 7 was derived except the angle α.

$\alpha_{111}$: changed in increments of 5° in the range greater than or equal to 0° and less than or equal to 60°

The phase of a higher-order mode was measured while the parameters were changed as described above. Thus, an equation 9 that was a relational expression between the parameters and the phase of a higher-order mode was derived. In the equation 9, Si_psi[deg.] is the angle $\alpha_{111}$.

$$\begin{aligned}y[deg.]=&(-77.5405307874512)+\\&0.00496521862619995\times(Si\_psi[deg.]-\\&44.3479880774963)+(-3.07514699616305)\times\\&(t\_Si_2[\lambda]-0.395628415300543)+\\&115.725430166886\times(t\_LT[\lambda]-\\&0.173919523099848)+75.6109484741613\times\\&(t\_SiN[\lambda]-0.0387729756582212)+\\&29.9143205043822\times(t\_SiO_2[\lambda]-\\&0.145404868355688)+0.00452378218877289\times\\&((Si\_psi[deg.]-44.3479880774963)\times(Si\_psi\\&[deg.]-44.3479880774963)-\\&147.519490487682)+(-0.127045459018856)\times\\&((Si\_psi[deg.]-44.3479880774963)\times(t\_Si_2[\lambda]-\\&0.395628415300543))+10.135015813019\times\\&((t\_Si_2[\lambda]-0.395628415300543)\times(t\_Si_2[\lambda]-\\&0.395628415300543)-0.0544331992323139)+\\&0.267609205446981\times((Si\_psi[deg.]-\\&44.3479880774963)\times(t\_LT[\lambda]-\\&0.173919523099848))+(-151.966315117959)\times\\&((t\_Si_2[\lambda]-0.395628415300543)\times(t\_LT[\lambda]-\\&0.173919523099848))+1.1818941610908\times\\&((Si\_psi[deg.]-44.3479880774963)\times(t\_SiN[\lambda]-\\&0.0387729756582212))+(-19.0228093275549)\times\\&((t\_Si_2[\lambda]-0.395628415300543)\times(t\_SiN[\lambda]-\\&0.0387729756582212))+25.2693219567039\times\\&((t\_LT[\lambda]-0.173919523099848)\times(t\_SiN[\lambda])-\\&0.0387729756582212))+1545.52112794945\times\\&((t\_SiN[\lambda]-0.0387729756582212)\times(t\_SiN[\lambda]-\\&0.0387729756582212)-\\&0.000519520243356094)+(-\\&0.39161225199813)\times((Si\_psi[deg.]-\\&44.3479880774963)\times(t\_SiO_2[\lambda]-\\&0.145404868355688))+22.0391330835907\times\\&((t\_Si_2[\lambda]-0.395628415300543)\times(t\_SiO_2[\lambda]-\\&0.145404868355688))+(-297.764935637906)\times\\&((t\_LT[\lambda]-0.173919523099848)\times(t\_SiO_2[\lambda]-\\&0.145404868355688))+982.324171494675\times\\&((t\_SiN[\lambda]-0.0387729756582212)\times(t\_SiO_2[\lambda]-\\&0.145404868355688))+420.570041600812\times\\&((t\_SiO_2[\lambda]-0.145404868355688)\times(t\_SiO_2[\lambda]-\\&0.145404868355688)-0.00124068307615005)\end{aligned}\qquad\text{Equation 9}$$

Si_psi[deg.], t_LT[λ], $t\_SiO_2[\lambda]$, t_SiN[λ], and $t\_Si_2[\lambda]$ each are preferably a value within a range with which y in the equation 9 is less than or equal to about −70. With this configuration, the phase of a higher-order mode is further reliably set to less than or equal to about −70[deg.]. Therefore, higher-order modes are further reliably and effectively reduced.

In addition, conditions in which the phase of a higher-order mode was reduced to less than or equal to about −80[deg.] were obtained in each of a case where the plane orientation of the silicon substrate 2 was (100), a case where the plane orientation of the silicon substrate 2 was (110), and a case where the plane orientation of the silicon substrate 2 was (111). More specifically, to obtain the conditions, an equation 10, an equation 11, and an equation 12 were derived while the parameters were changed within the range in which the phase of a higher-order mode was greater than or equal to −90[deg.] and less than or equal to about −70[deg.].

When the plane orientation of the silicon substrate 2 is (100), the equation 10 was derived as described above.

$$y[\text{deg.}]=(-78.3557914112162)+(-0.00785147182473267)\times(Si\_psi[\text{deg.}]-24.9802110817942)+(-1.32878861667394)\times(t\_Si_2[\lambda]-0.429221635883905)+(-41.7937386863014)\times(t\_LT[\lambda]-0.150923482849606)+35.6722090195008\times(t\_SiN[\lambda]-0.0500263852242746)+18.7743164986736\times(t\_SiO_2[\lambda]-0.145646437994723)+(-0.000765722206063909)\times((Si\_psi[\text{deg.}]-24.9802110817942)\times(Si\_psi[\text{deg.}]-24.9802110817942)-153.396706024045)+(-0.0463379291760545)\times((Si\_psi[\text{deg.}]-24.9802110817942)\times(t\_Si_2[\lambda]-0.429221635883905))+(-17.7293821535291)\times((t\_Si_2[\lambda]-0.429221635883905)\times(t\_Si_2[\lambda]-0.429221635883905)-0.0593208981070862)+(-1.3441873888418)\times((Si\_psi[\text{deg.}]-24.9802110817942)\times(t\_LT[\lambda]-0.150923482849606))+(-417.636233521175)\times((t\_Si_2[\lambda]-0.429221635883905)\times(t\_LT[\lambda]-0.150923482849606))+(-0.487351707638102)\times((Si\_psi[\text{deg.}]-24.9802110817942)\times(t\_SiN[\lambda]-0.0500263852242746))+(-25.3025544220714)\times((t\_Si_2[\lambda]-0.429221635883905)\times(t\_SiN[\lambda]-0.0500263852242746))+1666.3381560311\times((t\_LT[\lambda]-0.150923482849606)\times(t\_SiN[\lambda]-0.0500263852242746))+233.559062145034\times((t\_SiN[\lambda]-0.0500263852242746)\times(t\_SiN[\lambda]-0.0500263852242746)-0.000389115398806747)+(-0.148028298904273)\times((Si\_psi[\text{deg.}]-24.9802110817942)\times(t\_SiO_2[\lambda]-0.145646437994723))+(-63.9722673973965)\times((t\_Si\times[\lambda]-0.429221635883905)\times(t\_SiO_2[\lambda]-0.145646437994723))+1197.10044921435\times((t\_LT[\lambda]-0.150923482849606)\times(t\_SiO_2[AX]-0.145646437994723))+450.45656510444\times((t\_SiN[\lambda]-0.0500263852242746)\times(t\_SiO_2[AX])-0.145646437994723))+(-37.7857111587959)\times((t\_SiO_2[\lambda]-0.145646437994723)\times(t\_SiO_2[AX]-0.145646437994723)-0.0017158749939084) \quad \text{Equation 10}$$

Si_psi[deg.], t_LT[λ], $t\_SiO_2[\lambda]$, t_SiN[λ], and $t\_Si_2[\lambda]$ each are preferably a value within a range with which y in the equation 10 is less than or equal to about −80. With this configuration, the phase of a higher-order mode is further reliably set to less than or equal to about −80[deg.]. Therefore, higher-order modes are further reliably and further reduced.

When the plane orientation of the silicon substrate 2 is (110), the equation 11 was derived as described above.

$$y[\text{deg.}]=(-79.9409825800918)+0.00367175250563163\times(Si\_psi[\text{deg.}]-42.1225309675259)+(-1.19942177285592)\times(t\_Si_2[\lambda]-0.381570137261466)+91.8359644721651\times(t\_LT[\lambda]-0.164596585202533)+58.8431912005245\times(t\_SiN[\lambda]-0.0395698024774026)+16.9153289429696\times(t\_SiO_2[\lambda]-0.13875125544024)+0.00130491910714855\times((Si\_psi[\text{deg.}]-42.1225309675259)\times(Si\_psi[\text{deg.}]-42.1225309675259)-385.786124427809)+0.0745672315210127\times((Si\_psi[\text{deg}]-42.1225309675259)\times(t\_Si_2[\lambda]-0.381570137261466))+2.6699307571413\times((t\_Si_2[\lambda]-0.381570137261466)\times(t\_Si_2[\lambda]-0.381570137261466)-0.0456605075514713)+(-0.377889849052574)\times((Si\_psi[\text{deg.}]-42.1225309675259)\times(t\_LT[\lambda]-0.164596585202533))+(-43.4148735553507)\times((t\_Si_2[\lambda]-0.381570137261466)\times(t\_LT[\lambda]-0.164596585202533))+(-0.378387168121428)\times((Si\_psi[\text{deg.}]-42.1225309675259)\times(t\_SiN[\lambda]-0.0395698024774026))+(-20.545088460627)\times((t\_Si_2[\lambda]-0.381570137261466)\times(t\_SiN[\lambda]-0.0395698024774026))+232.919108783203\times((t\_LT[\lambda]-0.164596585202533)\times(t\_SiN[\lambda]-0.0395698024774026))+840.791113736585\times((t\_SiN[\lambda]-0.0395698024774026)\times(t\_SiN[\lambda]-0.0395698024774026)-0.000464855104179262)+0.190837727117146\times((Si\_psi[\text{deg.}]-42.1225309675259)\times(t\_SiO_2[\lambda]-0.13875125544024))+0.695837098714372\times((t\_Si_2[\lambda]-0.381570137261466)\times(t\_SiO_2[\lambda]-0.13875125544024))+(-184.621593720628)\times((t\_LT[\lambda]-0.164596585202533)\times(t\_SiO_2[\lambda]-0.13875125544024))+607.033426600094\times((t\_SiN[\lambda]-0.0395698024774026)\times(t\_SiO_2[\lambda]-0.13875125544024))+142.721242732228\times((t\_SiO_2[\lambda]-0.13875125544024)\times(t\_SiO_2[\lambda]-0.13875125544024)-0.0015256251030439) \quad \text{Equation 11}$$

Si_psi[deg.], t_LT[λ], $t\_SiO_2[\lambda]$, t_SiN[λ], and $t\_Si_2[\lambda]$ each are preferably a value within a range with which y in the equation 11 is less than or equal to about −80. With this configuration, the phase of a higher-order mode is further reliably set to less than or equal to about −80[deg.]. Therefore, higher-order modes are further reliably and further reduced.

When the plane orientation of the silicon substrate 2 is (111), the equation 12 was derived as described above.

$$y[\text{deg.}]=(-79.8683540124538)+0.0118371753456289\times(Si\_psi[\text{deg.}]-44.4595052524568)+(-1.99138796522555)\times(t\_Si_2[\lambda]-0.413673331074209)+88.0775643151379\times(t\_LT[\lambda]-0.167705862419511)+46.4734172707698\times(t\_SiN[\lambda]-0.0351321585903086)+14.4134894109961\times(t\_SiO_2[\lambda]-0.142222975262623)+0.0016708575222365\times((Si\_psi[\text{deg.}]-44.4595052524568)\times(Si\_psi[\text{deg.}]-44.4595052524568)-128.282924729805)+(-0.0463012101323173)\times((Si\_psi[\text{deg.}]-44.4595052524568)\times(t\_Si_2[\lambda]-0.413673331074209))+4.58192618035487\times((t\_Si_2[\lambda]-0.413673331074209)\times(t\_Si_2[\lambda]-0.413673331074209)-0.05167257915661)+0.524887931323933\times((Si\_psi[\text{deg}]-44.4595052524568)\times(t\_LT[\lambda]-0.167705862419511))+(-71.7492658390069)\times((t\_Si_2[\lambda]-0.413673331074209)\times(t\_LT[\lambda]-0.167705862419511))+0.73863390529294\times((Si\_psi[\text{deg.}]-44.4595052524568)\times(t\_SiN[\lambda]-0.0351321585903086))+(-42.8957552454222)\times((t\_Si_2[\lambda]-0.413673331074209)\times(t\_SiN[\lambda]-0.0351321585903086))+(-411.839865840595)\times((t\_LT[\lambda]-0.167705862419511)\times(t\_SiN[\lambda]-0.0351321585903086))+982.235412331017\times((t\_SiN[\lambda]-0.0351321585903086)\times(t\_SiN[\lambda]-0.0351321585903086)-0.000477142818756284)+(-0.236509133242243)\times((Si\_psi[\text{deg.}]-44.4595052524568)\times(t\_SiO_2[\lambda]-0.142222975262623))+17.2370398551984\times((t\_Si_2[\lambda]-0.413673331074209)\times(t\_SiO_2[\lambda]-0.142222975262623))+(-469.933137492789)\times((t\_LT[\lambda]-0.167705862419511)\times(t\_SiO_2[\lambda]-0.142222975262623))+541.748349798792\times((t\_SiN[\lambda]-0.0351321585903086)\times(t\_SiO_2[\lambda]-0.142222975262623))+226.311489477246\times((t\_SiO_2[\lambda]-0.142222975262623)\times(t\_SiO_2[\lambda]-0.142222975262623)-0.00116579711361478) \quad \text{Equation 12}$$

Si_psi[deg.], t_LT[λ], $t\_SiO_2[\lambda]$, t_SiN[λ], and $t\_Si_2[\lambda]$ each are preferably a value within a range with which y in the equation 12 is less than or equal to about −80. With this configuration, the phase of a higher-order mode is further reliably set to less than or equal to about −80[deg.]. Therefore, higher-order modes are further reliably and further reduced.

Subsequently, in the configuration having the multilayer substrate 39 similar to that of the fourth preferred embodiment shown in FIG. 21, the design parameters and the variable ranges of the design parameters were set as follows. The plane orientation of the silicon substrate 2 was set to (100).

- Silicon Substrate 2: Material monocrystal silicon, Plane orientation (100), and Thickness 20 μm
- Polysilicon Layer 3: Material polysilicon, and Thickness changed in increments of 0.1 μm in the range greater than or equal to 0.1 μm and less than or equal to 1.5 μm.
- Silicon Oxide Layer 5: Material $SiO_2$, and Thickness changed in increments of 0.05 μm in the range greater than or equal to 0.2 μm and less than or equal to 0.4 μm
- Titanium Oxide Layer 36: Material $TiO_2$, Thickness changed in increments of 0.02 μm in the range greater than or equal to 0.01 μm and less than or equal to 0.15 μm.
- Piezoelectric Layer 7: Material $LiTaO_3$, Cut Angle 40° Y, Euler angles (φ, θ, ψ) (0°, 130°, 0°), and Thickness changed in increments of 0.1 μm in the range greater than or equal to 0.3 μm and less than or equal to 0.4 μm
- Layer Configuration of Interdigital Transducer Electrode 8: Material Ti, AlCu, and Ti from the piezoelectric layer 7 side, the content of Cu in AlCu is 1 wt %, and Thickness 12 nm, 100 nm, and 4 nm from the piezoelectric layer 7 side
- Duty Ratio of Interdigital Transducer Electrode 8: 0.5
- Wave Length λ of Interdigital Transducer Electrode 8: 2 μm
- $\alpha_{100}$: changed in increments of 5° in the range greater than or equal to 0° and less than or equal to 45°

The phase of a higher-order mode was measured while the parameters were changed as described above. Thus, an equation 13 that was a relational expression between the parameters and the phase of a higher-order mode was derived. The thickness of the titanium oxide layer 36 is set to t_TiO$_2$[λ]. In the equation 13, Si_psi[deg.] is the angle $\alpha_{100}$.

$$y[\text{deg.}]=(-47.9946211404703)+1.21901050350713\times(\mathit{Si\_psi}[\text{deg.}]-19.0566037735849)+4.12041154986452\times(\mathit{t\_Si}_2[\lambda]-0.408490566037736)+228.432202102143\times(\mathit{t\_TiO}_2[\lambda]-0.0288364779874214)+(-33.1253993677708)\times(\mathit{t\_SiO}_2[\lambda]-0.160062893081761)+0.140472008263765\times((\mathit{Si\_psi}[\text{deg,}]-19.0566037735849)\times(\mathit{Si\_psi}[\text{deg.}]-19.0566037735849)-38.1037142518096)+(-5.44594625372052)\times((\mathit{Si\_psi}[\text{deg.}]-19.0566037735849)\times(\mathit{t\_Si}_2[\lambda]-0.408490566037736))+114.747133042737\times((\mathit{t\_Si}_2[\lambda]-0.408490566037736)\times(\mathit{t\_Si}_2[\lambda]-0.408490566037736)-0.0406983505399312)+10.4171695197979\times((\mathit{Si\_psi}[\text{deg.}]-19.0566037735849)\times(\mathit{t\_TiO}_2[\lambda]-0.0288364779874214))+(-526.442885320397)\times((\mathit{t\_Si}_2[\lambda]-0.408490566037736)\times(\mathit{t\_TiO}_2[\lambda]-0.0288364779874214))+(-298.795469471375)\times((\mathit{t\_TiO}_2[\lambda]-0.0288364779874214)\times(\mathit{t\_TiO}_2[\lambda]-0.0288364779874214)-0.000424904078161465)+(-50.1009078768921)\times((\mathit{Si\_psi}[\text{deg.}]-19.0566037735849)\times(\mathit{t\_SiO}_2[\lambda]-0.160062893081761))+1038.08065133921\times((\mathit{t\_Si}_2[\lambda])-0.408490566037736)\times(\mathit{t\_SiO}_2[\lambda]-0.160062893081761))+(-1286.74436136556)\times((\mathit{t\_TiO}_2[\lambda]-0.0288364779874214)\times(\mathit{t\_SiO}_2[\lambda]-0.160062893081761))+4158.8148931551\times((\mathit{t\_SiO}_2[\lambda]-0.160062893081761)\times(\mathit{t\_SiO}_2[\lambda]-0.160062893081761)-0.00134527906332819) \quad \text{Equation 13}$$

Si_psi[deg.], t_SiO$_2$[λ], t_TiO$_2$[λ], and t_Si$_2$[λ] each are preferably a value within a range with which y in the equation 13 is less than or equal to about −70. With this configuration, the phase of a higher-order mode is further reliably set to less than or equal to about −70 [deg.]. Therefore, higher-order modes are further reliably and effectively reduced.

In the configuration having a multilayer substrate 39 similar to that of the fourth preferred embodiment, the plane orientation of the silicon substrate 2 was set to (110), and the phase of a higher-order mode was measured while the parameters were changed. The design parameters and the variable ranges of the design parameters were similar to those when the equation 13 was derived except the angle α.

- $\alpha_{110}$: changed in increments of 10° in the range greater than or equal to 0° and less than or equal to 90°

The phase of a higher-order mode was measured while the parameters were changed as described above. Thus, an equation 14 that was a relational expression between the parameters and the phase of a higher-order mode was derived. In the equation 14, Si_psi[deg.] is the angle $\alpha_{110}$.

$$y[\text{deg.}]=(-66.0681190864303)+(-0.0323391014318074)\times(\mathit{Si\_psi}[\text{deg.}]-35.9295352323838)+0.997507104337367\times(\mathit{t\_Si}_2[\lambda]-0.394527736131933)+155.754971155735\times(\mathit{t\_TiO}_2[\lambda]-0.0378860569715143)+(-27.4736558331949)\times(\mathit{t\_SiO}_2[\lambda]-0.149887556221888)+0.00791197424152189\times((\mathit{Si\_psi}[\text{deg.}]-35.9295352323838)\times(\mathit{Si\_psi}[\text{deg.}]-35.9295352323838)-256.81962242267)+0.212504000649305\times((\mathit{Si\_psi}[\text{deg.}]-35.9295352323838)\times(\mathit{t\_Si}_2[\lambda]-0.394527736131933))+88.6294722534935\times((\mathit{t\_Si}_2[\lambda]-0.394527736131933)\times(\mathit{t\_Si}_2[\lambda]-0.394527736131933)-0.0392241772666888)+0.636412965393882\times((\mathit{Si\_psi}[\text{deg.}]-35.9295352323838)\times(\mathit{t\_TiO}_2[\lambda]-0.0378860569715143))+157.120610191294\times((\mathit{t\_Si}_2[\lambda]-0.394527736131933)\times(\mathit{t\_TiO}_2[\lambda]-0.0378860569715143))+544.188337615988\times((\mathit{t\_TiO}_2[\lambda]-0.0378860569715143)\times(\mathit{t\_TiO}_2[\lambda]-0.0378860569715143)-0.000522930045472021)+0.408031229502175\times((\mathit{Si\_psi}[\text{deg.}]-35.9295352323838)\times(\mathit{t\_SiO}_2[\lambda]-0.149887556221888))+(-46.0736528123303)\times((\mathit{t\_Si}_2[\lambda]-0.394527736131933)\times(\mathit{t\_SiO}_2[R]-0.149887556221888))+(-1322.9465191866)\times((\mathit{t\_TiO}_2[\lambda]-0.0378860569715143)\times(\mathit{t\_SiO}_2[\lambda]-0.149887556221888))+359.098768522305\times((\mathit{t\_SiO}_2[\lambda])-0.149887556221888)\times(\mathit{t\_SiO}_2[\lambda]-0.149887556221888)-0.00163979245384803) \quad \text{Equation 14}$$

Si_psi[deg.], t_SiO$_2$[λ], t_TiO$_2$[λ], and t_Si$_2$[λ] each are preferably a value within a range with which y in the equation 14 is less than or equal to about −70. With this configuration, the phase of a higher-order mode is further reliably set to less than or equal to about −70 [deg.]. Therefore, higher-order modes are further reliably and effectively reduced.

In the configuration of the fourth preferred embodiment, the plane orientation of the silicon substrate 2 was set to (111), and the phase of a higher-order mode was measured while the parameters were changed. The design parameters and the variable ranges of the design parameters were similar to those when the equation 13 was derived except the angle α.

- $\alpha_{111}$: changed in increments of 5° in the range greater than or equal to 0° and less than or equal to 60°

The phase of a higher-order mode was measured while the parameters were changed as described above. Thus, an equation 15 that was a relational expression between the parameters and the phase of a higher-order mode was derived. In the equation 15, Si_psi[deg.] is the angle $\alpha_{111}$.

$$y[\text{deg.}]=(-69.4030815485713)+(-0.269371737613053)\times(Si\_psi[\text{deg.}]-33.8730694980695)+(-4.68577968707475)\times(t\_Si_2[\lambda]-0.440745656370656)+176.177168052005\times(t\_LT[\lambda]-0.168858590733587)+73.1412385401181\times(t\_TiO_2[\lambda]-0.0300916988416992)+(-12.3739066281753)\times(t\_SiO_2[\lambda]-0.154983108108108)+0.00777703537774127C((Si\_psi[\text{deg.}]-33.8730694980695)\times(Si\_psi[\text{deg.}]-33.8730694980695)-508.406668570442)+0.121265989497045\times((Si\_psi[\text{deg.}]-33.8730694980695)\times(t\_Si_2[\lambda]-0.440745656370656))+17.8168374568741\times((t\_Si_2[\lambda]-0.440745656370656)\times(t\_Si_2[\lambda]-0.440745656370656)-0.0493816592475423)+1.34130425597794\times((Si\_psi[\text{deg.}]-33.8730694980695)\times(t\_LT[\lambda]-0.168858590733587))+(-5.11032690396319)\times((t\_Si_2[\lambda]-0.440745656370656)\times(t\_LT[\lambda]-0.168858590733587))+2.48016332864734\times((Si\_psi[\text{deg.}]-33.8730694980695)\times(t\_TiO_2[\lambda]-0.0300916988416992))+77.8145877606436\times((t\_Si_2[\lambda]-0.440745656370656)\times(t\_TiO_2[\lambda]-0.0300916988416992))+2112.87481803881\times((t\_LT[\lambda]-0.168858590733587)\times(t\_TiO_2[\lambda]-0.0300916988416992))+196.040518466468\times((t\_TiO_2[\lambda]-0.0300916988416992)\times(t\_TiO_2[\lambda]-0.0300916988416992)-0.000562395066225887)+(-0.969575065396993)\times((Si\_psi[\text{deg.}]-33.8730694980695)\times(t\_SiO_2[\lambda]-0.154983108108108))+(-138.70694337489)\times((t\_Si_2[\lambda]-0.440745656370656)\times(t\_SiO_2[\lambda]-0.154983108108108))+(-1100.04408119143)\times((t\_LT[\lambda]-0.168858590733587)\times(t\_SiO_2[\lambda]-0.154983108108108))+74.9944030678128\times((t\_TiO_2[\lambda]-0.0300916988416992)\times(t\_SiO_2[\lambda]-0.154983108108108))+117.812778429437\times((t\_SiO_2[\lambda]-0.154983108108108)\times(t\_SiO_2[\lambda]-0.154983108108108)-0.00117057162586093) \quad \text{Equation 15}$$

Si_psi[deg.], t_LT[λ], t_SiO$_2$[λ], t_TiO$_2$[λ], and t_Si$_2$[λ] each are preferably a value within a range with which y in the equation 15 is less than or equal to about −70. With this configuration, the phase of a higher-order mode is further reliably set to less than or equal to about −70[deg.]. Therefore, higher-order modes are further reliably and effectively reduced.

In addition, conditions in which the phase of a higher-order mode was reduced to less than or equal to about −80[deg.] were obtained in each of a case where the plane orientation of the silicon substrate 2 was (110) and a case where the plane orientation of the silicon substrate 2 was (111). More specifically, to obtain the conditions, an equation 16 and an equation 17 were derived while the parameters were changed within the range in which the phase of a higher-order mode was greater than or equal to −90[deg.] and less than or equal to about −70 [deg.].

When the plane orientation of the silicon substrate 2 is (110), the equation 16 was derived as described above.

$$y[\text{deg.}]=(-77.5229944626225)+(-0.0245637365901893)\times(Si\_psi[\text{deg.}]-34.5205479452055)+(-1.18326432300356)\times(t\_Si_2[\lambda]-0.408904109589041)+131.275052857081\times(t\_TiO_2[\lambda]-0.0160045662100456)+(-18.9167659640434)\times(t\_SiO_2[\lambda]-0.150228310502283)+0.00233031321934999\times((Si\_psi[\text{deg.}]-34.5205479452055)\times(Si\_psi[\text{deg.}]-34.5205479452055)-75.9116782385689)+(-0.0809397438263331)\times((Si\_psi[\text{deg.}]-34.5205479452055)\times(t\_Si_2[\lambda]-0.408904109589041))+43.1653284334043\times((t\_Si_2[\lambda]-0.408904109589041)\times(t\_Si_2[\lambda]-0.408904109589041)-0.0169869268780884)+(-0.255179621676294)\times((Si\_psi[\text{deg.}]-34.5205479452055)\times(t\_TiO_2[\lambda])-0.0160045662100456))+(-101.438420329361)\times((t\_Si_2[\lambda]-0.408904109589041)\times(t\_TiO_2[\lambda]-0.0160045662100456))+(-834.553397134957)\times((t\_TiO_2[\lambda]-0.0160045662100456)\times(t\_TiO_2[\lambda]-0.0160045662100456)-0.000126844728008173)+0.935627393438751\times((Si\_psi[\text{deg.}]-34.5205479452055)\times(t\_SiO_2[\lambda])-0.150228310502283))+(-21.1152350576513)\times((t\_Si_2[\lambda]-0.408904109589041)\times(t\_SiO_2[\lambda]-0.150228310502283))+(-41.8110780477077)\times((t\_TiO_2[\lambda]-0.0160045662100456)\times(t\_SiO_2[\lambda]-0.150228310502283))+263.939639423742\times((t\_SiO_2[\lambda]-0.150228310502283)\times(t\_SiO_2[\lambda]-0.150228310502283)-0.0016095369154104) \quad \text{Equation 16}$$

Si_psi[deg.], t_SiO$_2$[λ], t_TiO$_2$[λ], and t_Si$_2$[λ] each are preferably a value within a range with which y in the equation 16 is less than or equal to about −80. With this configuration, the phase of a higher-order mode is further reliably set to less than or equal to about −80[deg.]. Therefore, higher-order modes are further reliably and further reduced.

When the plane orientation of the silicon substrate 2 is (111), the equation 17 was derived as described above.

$$y[\text{deg.}]=(-78.9096176038851)+0.034903516437231\times(Si\_psi[\text{deg.}]-45.8453473132372)+(-2.02533584474356)\times(t\_Si_2[\lambda]-0.421068152031454)+81.4363661536651\times(t\_LT[\lambda]-0.156225425950199)+71.7903756668229\times(t\_TiO_2[\lambda]-0.0334862385321101)+(-3.53261283561548)\times(t\_SiO_2[\lambda]-0.149606815203146)+0.00246176329064131\times((Si\_psi[\text{deg.}]-45.8453473132372)\times(Si\_psi[\text{deg.}]-45.8453473132372)-143.191023568758)+(-0.0293712406566626)\times((Si\_psi[\text{deg.}]-45.8453473132372)\times(t\_Si_2[AX]-0.421068152031454))+0.972512275661977\times((t\_Si_2[\lambda]-0.421068152031454)\times(t\_Si_2[\lambda]-0.421068152031454)-0.0430997109516307)+0.30260322985253\times((Si\_psi[\text{deg.}]-45.8453473132372)\times(t\_LT[\lambda]-0.156225425950199))+(-23.2249863870645)\times((t\_Si_2[\lambda]-0.421068152031454)\times(t\_LT[\lambda]-0.156225425950199))+0.513496313876766\times((Si\_psi[\text{deg.}]-45.8453473132372)\times(t\_TiO_2[\lambda]-0.0334862385321101))+(-143.065209527507)\times((t\_Si_2[\lambda]-0.421068152031454)\times(t\_TiO_2[\lambda]-0.0334862385321101))+(-324.329178613173)\times((t\_LT[\lambda]-0.156225425950199)\times(t\_TiO_2[\lambda]-0.0334862385321101))+(-98.4001544132927)\times((t\_TiO_2[\lambda]-0.0334862385321101)\times(t\_TiO_2[\lambda]-0.0334862385321101)-0.000480867110753061)+(-1.15889670547368)\times((Si\_psi[\text{deg.}]-45.8453473132372)\times(t\_SiO_2[\lambda]-0.149606815203146))+(-50.3263112114924)\times((t\_Si_2[\lambda]-0.421068152031454)\times(t\_SiO_2[\lambda]-0.149606815203146))+(-209.199256641353)\times((t\_LT[\lambda]-0.156225425950199)\times(t\_SiO_2[\lambda]-0.149606815203146))+90.23187502294813\times((t\_TiO_2[\lambda]-0.0334862385321101)\times(t\_SiO_2[\lambda]-0.149606815203146))+347.448658314796\times((t\_SiO_2[\lambda]-0.149606815203146)\times(t\_SiO_2[\lambda]-0.149606815203146)-0.00114008131659363) \quad \text{Equation 17}$$

Si_psi[deg.], t_LT[λ], t_SiO$_2$[λ], t_TiO$_2$[λ], and t_Si$_2$[λ] each are preferably a value within a range with which y in the equation 17 is less than or equal to about −80. With this configuration, the phase of a higher-order mode is further reliably set to less than or equal to about −80[deg.]. Therefore, higher-order modes are further reliably and further reduced.

In the above description, an example in which the piezoelectric layer 7 is a lithium tantalate layer has been described. Hereinafter, an example in which the piezoelectric layer 7 is a lithium niobate layer will be described with reference to FIG. 17.

A fifth preferred embodiment of the present invention differs from the second preferred embodiment in that the piezoelectric layer 7 is a lithium niobate layer. Other than the above points, the acoustic wave device according to the fifth preferred embodiment has a similar configuration to the acoustic wave device according to the second preferred embodiment.

Here, the phase characteristics of the acoustic wave device having the configuration of the fifth preferred embodiment were measured. The design parameters of the acoustic wave device are as follows.

Silicon Substrate 2: Material monocrystal silicon, Plane orientation (111), Euler angles ((φ, θ, ψ) (−45°, −54.7°, 30°), and Thickness 20 μm Polysilicon Layer 3: Material polysilicon, and Thickness 1 μm Silicon Oxide Layer 5: Material $SiO_2$, and Thickness 300 nm Silicon Nitride Layer 26: Material SiN, and Thickness 30 nm Piezoelectric Layer 7: Material $LiNbO_3$, Cut Angle 40° Y, Euler angles ((φ, θ, ψ) (0°, 130°, 0°), and Thickness 300 nm Layer Configuration of Interdigital Transducer Electrode 8: Material Ti, AlCu, and Ti from the piezoelectric layer 7 side, the content of Cu in AlCu is 1 wt %, and Thickness 10 nm, 100 nm, and 4 nm from the piezoelectric layer 7 side Duty Ratio of Interdigital Transducer Electrode 8: 0.5

Wave Length λ of Interdigital Transducer Electrode 8: 2 μm

Protective Film 29: Material $SiO_2$, and Thickness 30 nm

Here, the present preferred embodiment and a second comparative example are compared with each other to demonstrate that higher-order modes are reduced in a wide band according to the present preferred embodiment. The second comparative example differs from the present preferred embodiment in that, in the multilayer substrate, a silicon nitride layer is laminated instead of the polysilicon layer.

Figure 23:
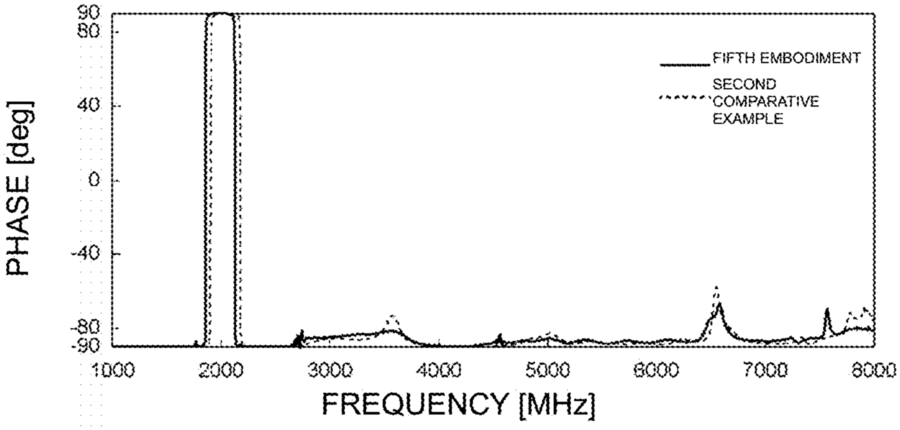
FIG. 23 is a graph that shows the phase characteristics of an acoustic wave device according to a fifth preferred embodiment of the present invention and the phase characteristics of an acoustic wave device according to a second comparative example.

FIG. 23 is a graph that shows the phase characteristics of the acoustic wave device according to the fifth preferred embodiment and the phase characteristics of an acoustic wave device according to the second comparative example.

As shown in FIG. 23, it appears that higher-order modes are reduced in a wider band in the fifth preferred embodiment than in the second comparative example. In this way, in the fifth preferred embodiment as well, as in the case of the second preferred embodiment, higher-order modes are reduced in a wide band. In addition, as shown in FIG. 23, it appears that the band of a main mode is expanded.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a silicon substrate;

a polysilicon layer provided on the silicon substrate;

a silicon oxide layer directly or indirectly provided on the polysilicon layer;

a piezoelectric layer directly or indirectly provided on the silicon oxide layer; and an interdigital transducer electrode provided on the piezoelectric layer; wherein a plane orientation of the silicon substrate is any one of (100), (110), and (111);

where a wave length that is defined by an electrode finger pitch of the interdigital transducer electrode is λ, a thickness of the piezoelectric layer is less than or equal to about 1λ; and a thickness of the polysilicon layer is greater than a thickness of the silicon oxide layer.

2. The acoustic wave device according to claim 1, further comprising a silicon nitride layer provided between the silicon oxide layer and the piezoelectric layer.

3. The acoustic wave device according to claim 1, further comprising a silicon nitride layer provided between the polysilicon layer and the silicon oxide layer.

4. The acoustic wave device according to claim 1, further comprising a titanium oxide layer provided between the silicon oxide layer and the piezoelectric layer.

5. The acoustic wave device according to claim 1, wherein the piezoelectric layer is a lithium tantalate layer;

the piezoelectric layer has crystallographic axes ($X_P$, $Y_P$, $Z_P$);

the plane orientation of the silicon substrate is (100);

in the silicon substrate of which the plane orientation is (100), a directional vector obtained by projecting the $Z_P$-axis onto a (100) plane of the silicon substrate is $k_{100}$, and an angle between the directional vector $k_{100}$ and a [001] direction of silicon that is a component of the silicon substrate is an angle of $\alpha_{100}$; and where the angle $\alpha_{100}$ is Si_psi[deg.], a thickness of the piezoelectric layer is t_LT[λ], a thickness of the silicon oxide layer is t_$SiO_2$[λ], and a thickness of the polysilicon layer is t_$Si_2$[λ], the Si_psi[deg.], the t_LT[λ], the t_$SiO_2$[λ], and the t_$Si_2$[λ] each are a value within a range with which y in equation 1 is less than or equal to about −70:

$$
\begin{aligned}
y[\text{deg.}]=&(-72.1492542241195)+0.627588217157224\times(\text{Si\_psi}[\text{deg}]-21.7083333333333)+(-1.93347870945237)\times(t\_\text{Si}_2[\lambda]-0.4525)+\\
&72.3846086764674\times(t\_\text{LT}[\lambda]-0.160833333333333)+(-67.3219584197057)\times(t\_\text{SiO}_2[\lambda]-0.16625)+0.0000655654050315201\times\\
&((\text{Si\_psi}[\text{deg.}]-21.7083333333333)\times(\text{Si\_psi}[\text{deg.}]-21.7083333333333)-25.2065972222222)+(-2.34857364418332)\times\\
&((\text{Si\_psi}[\text{deg.}]-21.7083333333333)\times((t\_\text{Si}_2[\lambda]-0.4525))+37.0048979126418\times((t\_\text{Si}_2[\lambda]-0.4525)\times((t\_\text{Si}_2[\lambda]-0.4525)-\\
&0.0360354166666667)+7.0771357128953\times((\text{Si\_psi}[\text{deg.}]-21.7083333333333)\times((\text{t\_LT}[\lambda]-0.160833333333333))+(-10.057857939681)\times\\
&((\text{t\_Si}_2[\lambda]-0.4525)\times(\text{t\_LT}[\lambda]-0.160833333333333))+1.5071677761 1893\times((\text{Si\_psi}[\text{deg.}]-21.7083333333333)\times(\text{t\_SiO}_2[\lambda]-\\
&0.16625))+426.86632497558\times(((\text{t\_Si}_2[\lambda]-0.4525)\times((\text{t\_SiO}_2[\lambda])-0.16625))+925.280868396996\times((\text{t\_LT}[\lambda]-\\
&0.160833333333333)\times(\text{t\_SiO}_2[\lambda]-0.16625))+988.798729044457\times((\text{t\_SiO}_2[\lambda]-0.16625)\times(\text{t\_SiO}_2[\lambda]-0.16625)-0.000871354166666668). \quad \text{Equation 1}
\end{aligned}
$$

6. The acoustic wave device according to claim 1, wherein the piezoelectric layer is a lithium tantalate layer;

the piezoelectric layer has crystallographic axes ($X_P$, $Y_P$, $Z_P$);

the plane orientation of the silicon substrate is (110);

in the silicon substrate of which the plane orientation is (110), a directional vector obtained by projecting the $Z_P$-axis onto a (110) plane of the silicon substrate is $k_{110}$, and an angle between the directional vector $k_{110}$ and a [001] direction of silicon that is a component of the silicon substrate is an angle of $\alpha_{110}$; and where the angle $\alpha_{110}$ is Si_psi[deg.], a thickness of the piezoelectric layer is t_LT[λ], a thickness of the silicon oxide layer is t_SiO$_2$[λ], and a thickness of the polysilicon layer is t_Si$_2$[λ], the Si_psi[deg.], the t_LT[λ], the t_SiO$_2$[λ], and the t_Si$_2$[λ] each are a value within a range with which y in equation 2 is less than or equal to about −70:

$$y[\text{deg.}]=(78.1876454049157)+(-0.182894322081067)\times(\mathit{Si\_psi}[\text{deg.}]-28.1088082901554)+6.18390256271178\times(t\_Si_2[\lambda]-0.39961139896373)+116.669335737855\times(t\_LT[\lambda]-0.169948186528498)+10.3573467893808\times(t\_SiO_2[\lambda]-0.144041450777202)+0.0110735958981267\times((\mathit{Si\_psi}[\text{deg.}]-28.1088082901554)\times(\mathit{Si\_psi}[\text{deg.}]-28.1088082901554)-189.946709978791)+(-0.246858144090431)\times((\mathit{Si\_psi}[\text{deg.}]-28.1088082901554)\times(t\_Si_2[\lambda]-0.39961139896373)+22.031016276383\times((t\_Si_2[\lambda]-0.39961139896373)\times(t\_Si_2[\lambda]-0.39961139896373)-0.0484389681602191)+(-X.0545756011518778)\times((\mathit{Si\_psi}[\text{deg.}]-28.1088082901554)\times(t\_LT[\lambda]-0.169948186528498))+(-32.427969747408)\times((t\_Si_2[\lambda]-0.39961139896373)\times((t\_LT[\lambda]-0.169948186528498))+(-2.62164982026802)\times((\mathit{Si\_psi}[\text{deg.}]-28.1088082901554)\times(t\_SiO_2[\lambda]-0.144041450777202))+(-112.759047075747)\times((t\_Si_2[\lambda]-0.39961139896373)\times((t\_SiO_2[\lambda]-0.144041450777202))+(-604.832727678973)\times((t\_LT[\lambda]-0.169948186528498)\times((t\_SiO_2[\lambda]-0.144041450777202))+326.415587634024\times((t\_SiO_2[\lambda]-0.144041450777202)\times((t\_SiO_2[\lambda]-0.144041450777202)-0.00120154232328385). \quad \text{Equation 2}$$

7. The acoustic wave device according to claim 1, wherein the piezoelectric layer is a lithium tantalate layer;

the piezoelectric layer has crystallographic axes ($X_P$, $Y_P$, $Z_P$);

the plane orientation of the silicon substrate is (111);

in the silicon substrate of which the plane orientation is (111), a directional vector obtained by projecting the $Z_P$-axis onto a (111) plane of the silicon substrate is $k_{111}$, and an angle between the directional vector $k_{111}$ and a [11-2] direction of silicon that is a component of the silicon substrate is an angle of $\alpha_{111}$; and where the angle $\alpha_{111}$ is Si_psi[deg.], a thickness of the piezoelectric layer is t_LT[λ], a thickness of the silicon oxide layer is t_SiO$_2$[λ], and a thickness of the polysilicon layer is t_Si$_2$[λ], the Si_psi[deg.], the t_LT[λ], the t_SiO$_2$[λ], and the t_Si$_2$[λ] each are a value within a range with which y in equation 3 is less than or equal to about −70:

$$y[\text{deg.}]=(77.9109394183719)+(-0.0492368384201428)\times(\mathit{Si\_psi}[\text{deg.}]-45.2068126520681)+0.525124426223863\times(t\_Si_2[\lambda]-0.426216545012165)+117.400884406373\times(t\_LT[\lambda]-0.174330900243311)+(-2.62484877324049)\times(t\_SiO_2[\lambda]-0.15139902676399)+0.00307563131201403\times((\mathit{Si\_psi}[\text{deg.}]-45.2068126520681)\times(\mathit{Si\_psi}[\text{deg.}]-45.2068126520681)-182.925598356629)+(-0.0261801752592506)\times((\mathit{Si\_psi}[\text{deg.}]-45.2068126520681)\times(t\_Si_2[\lambda]-0.426216545012165))+23.8987529211434\times((t\_Si_2[\lambda]-0.426216545012165)\times(t\_Si_2[\lambda]-0.426216545012165)-0.0481296027432942)+1.52616542281399\times((\mathit{Si\_psi}[\text{deg.}]-45.2068126520681))\times(t\_LT[\lambda]-0.174330900243311))+(-129.002027283367)\times((t\_Si_2[\lambda]-0.426216545012165)\times((t\_LT[\lambda]-0.174330900243311))+(-1.22761778451819)\times((\mathit{Si\_psi}[\text{deg.}]-45.2068126520681)\times((t\_SiO_2[\lambda]-0.15139902676399))+(-42.6041784800926)\times((t\_Si_2[\lambda]-0.426216545012165)\times(t\_SiO_2[\lambda]-0.15139902676399))+(-468.84116493048)\times((t\_LT[\lambda]-0.174330900243311)\times(t\_SiO_2[\lambda]-0.15139902676399))+(-8.20635607220859)\times((t\_SiO_2[\lambda]-0.15139902676399)\times(t\_SiO_2[\lambda]-0.15139902676399)-0.00128301839321 34). \quad \text{Equation 3}$$

8. The acoustic wave device according to claim 1, wherein the piezoelectric layer is a lithium tantalate layer;

the piezoelectric layer has crystallographic axes ($X_P$, $Y_P$, $Z_P$);

the plane orientation of the silicon substrate is (100);

in the silicon substrate of which the plane orientation is (100), a directional vector obtained by projecting the $Z_P$-axis onto a (100) plane of the silicon substrate is $k_{100}$, and an angle between the directional vector $k_{100}$ and a [001] direction of silicon that is a component of the silicon substrate is an angle of $\alpha_{100}$; and where the angle $\alpha_{100}$ is Si_psi[deg.], a thickness of the piezoelectric layer is t_LT[λ], a thickness of the silicon oxide layer is t_SiO$_2$[λ], and a thickness of the polysilicon layer is t_Si$_2$[λ], the Si_psi[deg.], the t_LT[λ], the t_SiO$_2$[λ], and the t_Si$_2$[λ] each are a value within a range with which y in equation 4 is less than or equal to about −80:

$$y[\text{deg.}]=(-75.3156232479379)+0.63547968892276\times(\mathit{Si\_psi}[\text{deg}]-20.9090909090909)+(-2.02838142816204)\times(t\_Si_2[\lambda]-0.439772727272727)+90.1874317877843\times(t\_LT[\lambda]-0.151136363636364)+(-71.2997621594781)\times(t\_SiO_2[\lambda]-0.171590909090909)+0.108397383766316\times((\mathit{Si\_psi}[\text{deg.}]-20.9090909090909)\times(\mathit{Si\_psi}[\text{deg.}]-20.9090909090909)-13.9462809917355)+(-3.76982864951476)\times((\mathit{Si\_psi}[\text{deg.}]-20.9090909090909)\times(t\_Si_2[\lambda]-0.439772727272727))+37.3378798744213\times((t\_Si_2[\lambda]-0.439772727272727)\times(t\_Si_2[\lambda]-0.439772727272727)-0.0358613119834711)+(-23.7942425679855)\times((\mathit{Si\_psi}[\text{deg.}]-20.9090909090909)\times(t\_SiO_2[\lambda]-0.171590909090909))+462.018905986831\times((t\_Si_2[\lambda])-0.439772727272727)\times(t\_SiO_2[\lambda]-0.171590909090909))+1223.13016730739\times(((t\_SiO_2[\lambda]-0.171590909090909)\times(t\_SiO_2[\lambda]-0.171590909090909)-0.000641787190082645). \quad \text{Equation 4}$$

9. The acoustic wave device according to claim 1, wherein the piezoelectric layer is a lithium tantalate layer;

the piezoelectric layer has crystallographic axes ($X_P$, $Y_P$, $Z_P$);

the plane orientation of the silicon substrate is (110);

in the silicon substrate of which the plane orientation is (110), a directional vector obtained by projecting the $Z_P$-axis onto a (110) plane of the silicon substrate is $k_{110}$, and an angle between the directional vector $k_{110}$ and a [001] direction of silicon that is a component of the silicon substrate is an angle of $\alpha_{110}$, and where the angle $\alpha_{110}$ is Si_psi[deg.], a thickness of the piezoelectric layer is t_LT[λ], a thickness of the silicon oxide layer is t_SiO$_2$[λ], and a thickness of the polysilicon layer is t_Si$_2$[λ], the Si_psi[deg.], the t_LT[λ], the t_SiO$_2$[λ], and the t_Si$_2$[λ] each are a value within a range with which y in equation 5 is less than or equal to about −80:

$$y[\text{deg.}]=(81.4138269086073)+(-0.100532115186538)\times(\mathit{Si\_psi}[\text{deg.}]-29.1379310344828)+0.845708574223377\times(t\_Si_2[\lambda]-0.385689655172414)+87.6682874459356\times(t\_LT[\lambda]-0.166724137931034)+(-0.137780433371857)\times(t\_SiO_2[\lambda]-0.145)+0.00337749443465239\times((\mathit{Si\_psi}[\text{deg.}]-$$

$$29.1379310344828)\times(Si\_psi[\text{deg.}]-29.1379310344828)-127.877526753864)+(-0.116548121456389)\times((Si\_psi[\text{deg.}]-29.1379310344828)\times(t\_Si_2[\lambda]-0.385689655172414))+11.8893452691356\times((t\_Si_2[\lambda]-0.385689655172414)\times(t\_Si_2[\lambda]-0.385689655172414)-0.0448900416171225)+0.333200244545922\times((Si\_psi[\text{deg.}]-29.1379310344828)\times(t\_LT[\lambda]-0.166724137931034))+55.2630600466406\times((t\_Si_2[\lambda]-0.385689655172414)\times(t\_LT[\lambda]-0.166724137931034))+(-0.296582437395607)\times((Si\_psi[\text{deg.}]-29.1379310344828)\times(t\_SiO_2[\lambda]-0.145))+(-67.4578937630203)\times((t\_Si_2[\lambda]-0.385689655172414)\times(t\_SiO_2[\lambda]-0.145))+(-376.292315976729)\times((t\_LT[\lambda])-0.166724137931034)\times(t\_SiO_2[\lambda]-0.145))+48.6290874437329\times((t\_SiO_2[\lambda]-0.145)\times((t\_SiO_2[\lambda]-0.145)-0.00120775862068966). \quad \text{Equation 5}$$

10. The acoustic wave device according to claim 1, wherein the piezoelectric layer is a lithium tantalate layer;

the piezoelectric layer has crystallographic axes ($X_P$, $Y_P$, $Z_P$);

the plane orientation of the silicon substrate is (111);

in the silicon substrate of which the plane orientation is (111), a directional vector obtained by projecting the $Z_P$-axis onto a (111) plane of the silicon substrate is $k_{111}$, and an angle between the directional vector $k_{111}$ and a [11-2] direction of silicon that is a component of the silicon substrate is an angle of $\alpha_{111}$; and where the angle $\alpha_{111}$ is Si_psi[deg.], a thickness of the piezoelectric layer is t_LT[λ], a thickness of the silicon oxide layer is t_$SiO_2$[λ], and a thickness of the polysilicon layer is t_$Si_2$[λ], the Si_psi[deg.], the t_LT[λ], the t_$SiO_2$[λ], and the t_$Si_2$[λ] each are a value within a range with which y in equation 6 is less than or equal to about −80:

$$y[\text{deg.}]=(-79.8924944284088)+0.033261334588906\times(Si\_psi[\text{deg.}]-39.3173431734317)+3.93783296791666\times(t\_Si_2[\lambda]-0.416974169741698)+80.6680077909648\times(t\_LT[\lambda]-0.17140221402214)+13.2276438709535\times(t\_SiO_2[\lambda]-0.148431734317343)+(-0.00907764275073328)\times((Si\_psi[\text{deg.}]-39.3173431734317)\times(Si\_psi[\text{deg.}]-39.3173431734317)-21.2129464468077)+0.000540095694459618\times((Si\_psi[\text{deg.}]-39.3173431734317)\times(t\_Si_2[\lambda]-0.416974169741698))+5.79698263968963\times((t\_Si_2[\lambda]-0.416974169741698)\times(t\_Si_2[\lambda]-0.416974169741698)-0.0400439808826132)+(-0.136650035849863)\times((Si\_psi[\text{deg.}]-39.3173431734317)\times(t\_LT[\lambda]-0.17140221402214))+(-20.3328823416631)\times((t\_Si_2[\lambda]-0.416974169741698)\times(t\_LT[\lambda]-0.17140221402214))+(-2.22480760136672)\times((Si\_psi[\text{deg.}]-39.3173431734317)\times(t\_SiO_2[\lambda]-0.148431734317343))+(-13.0975601885972)\times((t\_Si_2[\lambda]-0.416974169741698)\times(t\_SiO_2[\lambda]-0.148431734317343))+(-511.743077543129)\times((t\_LT[\lambda]-0.17140221402214)\times(t\_SiO_2[\lambda]-0.148431734317343))+137.213612130809\times((t\_SiO_2[\lambda]-0.148431734317343)\times(t\_SiO_2[\lambda]-0.148431734317343)-0.00135593537669694). \quad \text{Equation 6}$$

11. The acoustic wave device according to claim 2, wherein the piezoelectric layer is a lithium tantalate layer;

the piezoelectric layer has crystallographic axes ($X_P$, $Y_P$, $Z_P$);

the plane orientation of the silicon substrate is (100);

in the silicon substrate of which the plane orientation is (100), a directional vector obtained by projecting the $Z_P$-axis onto a (100) plane of the silicon substrate is $k_{100}$, and an angle between the directional vector $k_{100}$ and a [001] direction of silicon that is a component of the silicon substrate is an angle of $\alpha_{100}$; and where the angle $\alpha_{100}$ is Si_psi[deg.], a thickness of the piezoelectric layer is t_LT[λ], a thickness of the silicon nitride layer is t_SiN[λ], a thickness of the silicon oxide layer is t_$SiO_2$[λ], and a thickness of the polysilicon layer is t_$Si_2$[λ], the Si_psi[deg.], the t_LT[λ], the t_SiN[λ], the t_$SiO_2$[λ], and the t_$Si_2$[λ] each are a value within a range with which y in equation 7 is less than or equal to about −70:

$$y[\text{deg.}]=(-67.7782730918073)+0.0667732718475358\times(Si\_psi[\text{deg.}]-25.6259314456036)+(-6.71256568714434)\times(t\_Si_2[\lambda]-0.426192250372578)+177.355083873051\times(t\_LT[\lambda]-0.16602086438151)+(-64.7093491078986)\times(t\_SiN[\lambda]-0.0465201192250378)+1.0890884781807\times(t\_SiO_2[\lambda]-0.155793591654245)+0.000179985859065592\times(Si\_psi[\text{deg.}]-25.6259314456036)\times(Si\_psi[\text{deg.}]-25.6259314456036)-130.38317256758)+(-0.329348427439478)\times((Si\_psi[\text{deg.}]-25.6259314456036)\times(t\_Si_2[\lambda]-0.426192250372578))+(-33.1084698932093)\times((t\_Si_2[\lambda]-0.426192250372578)\times(t\_Si_2[\lambda]-0.426192250372578)-0.0504801359160987)+1.52146775761601\times((Si\_psi[\text{deg.}]-25.6259314456036)\times(t\_LT[\lambda]-0.16602086438151))+14.5974162574468\times((t\_Si_2[\lambda]-0.426192250372578)\times(t\_LT[\lambda]-0.16602086438151))+0\times((t\_LT[\lambda]-0.16602086438151)\times(t\_LT[\lambda]-0.16602086438151)-0.000544375123544922)+(-4.94058423048505)\times((Si\_psi[\text{deg.}]-25.6259314456036)\times((t\_SiN[\lambda]-0.0465201192250378))+138.799085167873\times((t\_Si_2[\lambda]-0.426192250372578)\times(t\_SiN[\lambda]-0.0465201192250378))+1746.7447498235\times((t\_LT[\lambda]-0.16602086438151)\times(t\_SiN[\lambda]-0.0465201192250378))+2167.04168685901\times((t\_SiN[\lambda]-0.0465201192250378)\times(t\_SiN[\lambda]-0.0465201192250378)-0.000465274930537198)+(-0.931372972560935)\times((Si\_psi[\text{deg.}]-25.6259314456036)\times(t\_SiO_2[\lambda]-0.155793591654245))+(-79.4377446578721)\times((t\_Si_2[\lambda]-0.426192250372578)\times(t\_SiO_2[\lambda]-0.155793591654245))+(-86.9697272546991)\times((t\_LT[\lambda]-0.16602086438151)\times(t\_SiO_2[\lambda]-0.155793591654245))+1966.46522796354\times((t\_SiN[\lambda]-0.0465201192250378)\times(t\_SiO_2[\lambda]-0.155793591654245))+169.040605778099\times((t\_SiO_2[\lambda]-0.155793591654245)\times(t\_SiO_2[\lambda]-0.155793591654245)-0.00164210493657841). \quad \text{Equation 7}$$

12. The acoustic wave device according to claim 2, wherein the piezoelectric layer is a lithium tantalate layer;

the piezoelectric layer has crystallographic axes ($X_P$, $Y_P$, $Z_P$);

the plane orientation of the silicon substrate is (110);

in the silicon substrate of which the plane orientation is (110), a directional vector obtained by projecting the $Z_P$-axis onto a (110) plane of the silicon substrate is $k_{110}$, and an angle between the directional vector $k_{110}$ and a [001] direction of silicon that is a component of the silicon substrate is an angle of $\alpha_{110}$; and where the angle $\alpha_{110}$ is Si_psi[deg.], a thickness of the piezoelectric layer is t_LT[λ], a thickness of the silicon nitride layer is t_SiN[λ], a thickness of the silicon oxide layer is t_$SiO_2$[λ], and a thickness of the polysilicon layer is t_$Si_2$[λ], the Si_psi[deg.], the t_LT[λ], the t_SiN[λ], the t_$SiO_2$[λ], and the t_$Si_2$[λ] each are a value within a range with which y in equation 8 is less than or equal to about −70:

$$
\begin{aligned}
y[\text{deg.}]=&(-75.0174122935603)+(-0.00810936153116664)\times(Si\_psi[\text{deg.}]-42.0340722495895)+1.98135617767495\times(t\_Si_2[\lambda]-0.385026683087027)+143.173790020328\times\\
&(t\_LT[\lambda]-0.17306034482757)+16.4148627328736\times(t\_SiN[\lambda]-0.04207922824302)+50.4122771861205\times\\
&(t\_SiO_2[\lambda])-0.144909688013139)+0.00619821963137332\times((Si\_psi[\text{deg.}]-42.0340722495895)\times(Si\_psi[\text{deg.}]-42.0340722495895)-514.232829229589)+\\
&0.020323078287526\times((Si\_psi[\text{deg.}]-42.0340722495895)\times(t\_Si_2[\lambda]-0.385026683087027))+1.15443318031007\times\\
&((t\_Si_2[\lambda]-0.385026683087027)\times(t\_Si_2[\lambda]-0.385026683087027)-0.0477966331139576)+\\
&0.472662465737381\times((Si\_psi[\text{deg.}]-42.0340722495895)\times(t\_LT[\lambda]-0.17306034482757))+(-105.2996012677)\times\\
&((t\_Si_2[\lambda]-0.385026683087027)\times(t\_LT[\lambda]-0.17306034482757))+(-1.29517116632701)\times\\
&((Si\_psi[\text{deg.}]-42.0340722495895)\times(t\_SiN[\lambda]-0.04207922824302))+(-26.1801037669841)\times\\
&((t\_Si_2[\lambda]-0.385026683087027)\times(t\_SiN[\lambda])-0.04207922824302))+168.1334353773\times((t\_LT[\lambda]-0.17306034482757)\times(t\_SiN[\lambda]-0.04207922824302))+2120.76431830662\times\\
&((t\_SiN[\lambda]-0.04207922824302)\times X(t\_SiN[\lambda]-0.04207922824302)-0.000508197335364991)+\\
&(-0.687562974959064)\times((Si\_psi[\text{deg.}]-42.0340722495895)\times(t\_SiO_2[\lambda]-0.144909688013139))+15.3482271106745\times\\
&((t\_Si_2[\lambda]-0.385026683087027)\times(t\_SiO_2[\lambda]-0.144909688013139))+(-358.720795782422)\times\\
&((t\_LT[\lambda]-0.17306034482757)\times(t\_SiO_2[\lambda]-0.144909688013139))+1062.30534015379\times\\
&((t\_SiN[\lambda]-0.04207922824302)\times(t\_SiO_2[\lambda]-0.144909688013139))+248.937429294479\times\\
&((t\_SiO_2[\lambda]-0.144909688013139)\times(t\_SiO_2[\lambda]-0.144909688013139)-0.00162330875671721).
\end{aligned}
\qquad \text{Equation 8}
$$

13. The acoustic wave device according to claim 2, wherein the piezoelectric layer is a lithium tantalate layer;

the piezoelectric layer has crystallographic axes ($X_P$, $Y_P$, $Z_P$);

the plane orientation of the silicon substrate is (111);

in the silicon substrate of which the plane orientation is (111), a directional vector obtained by projecting the $Z_P$-axis onto a (111) plane of the silicon substrate is $k_{111}$, and an angle between the directional vector $k_{111}$ and a [11-2] direction of silicon that is a component of the silicon substrate is an angle of $\alpha_{111}$; and where the angle $\alpha_{111}$ is Si_psi[deg.], a thickness of the piezoelectric layer is t_LT[λ], a thickness of the silicon nitride layer is t_SiN[λ], a thickness of the silicon oxide layer is t_$SiO_2$[λ], and a thickness of the polysilicon layer is t_$Si_2$[λ], the Si_psi[deg.], the t_LT[λ], the t_SiN[λ], the t_$SiO_2$[λ], and the t_$Si_2$[λ] each are a value within a range with which y in equation 9 is less than or equal to about −70:

$$
\begin{aligned}
y[\text{deg.}]=&(-77.5405307874512)+0.00496521862619995\times(Si\_psi[\text{deg.}]-44.3479880774963)+(-3.07514699616305)\times\\
&(t\_Si_2[\lambda]-0.395628415300543)+115.725430166886\times(t\_LT[\lambda]-0.173919523099848)+75.6109484741613\times\\
&(t\_SiN[\lambda]-0.0387729756582212)+29.9143205043822\times(t\_SiO_2[\lambda]-0.145404868355688)+0.00452378218877289\times\\
&((Si\_psi[\text{deg.}]-44.3479880774963)\times(Si\_psi[\text{deg.}]-44.3479880774963)-147.519490487682)+(-0.127045459018856)\times\\
&((Si\_psi[\text{deg.}]-44.3479880774963)\times(t\_Si_2[\lambda]-0.395628415300543))+10.135015813019\times\\
&((t\_Si_2[\lambda]-0.395628415300543)\times(t\_Si_2[\lambda]-0.395628415300543)-0.0544331992323139)+\\
&0.267609205446981\times((Si\_psi[\text{deg.}]-44.3479880774963)\times(t\_LT[\lambda]-0.173919523099848))+(-151.966315117959)\times\\
&((t\_Si_2[\lambda]-0.395628415300543)\times(t\_LT[\lambda]-0.173919523099848))+1.1818941610908\times\\
&((Si\_psi[\text{deg.}]-44.3479880774963)\times(t\_SiN[\lambda]-0.0387729756582212))+(-19.0228093275549)\times\\
&((t\_Si_2[\lambda]-0.395628415300543)\times(t\_SiN[\lambda]-0.0387729756582212))+25.2693219567039\times\\
&((t\_LT[\lambda]-0.173919523099848)\times(t\_SiN[\lambda])-0.0387729756582212))+1545.52112794945\times\\
&((t\_SiN[\lambda]-0.0387729756582212)\times(t\_SiN[\lambda]-0.0387729756582212)-0.000519520243356094)+(-0.39161225199813)\times((Si\_psi[\text{deg.}]-44.3479880774963)\times(t\_SiO_2[\lambda]-0.145404868355688))+22.0391330835907\times\\
&((t\_Si_2[\lambda]-0.395628415300543)\times(t\_SiO_2[\lambda]-0.145404868355688))+(-297.764935637906)\times\\
&((t\_LT[\lambda]-0.173919523099848)\times(t\_SiO_2[\lambda]-0.145404868355688))+982.324171494675\times\\
&((t\_SiN[\lambda]-0.0387729756582212)\times(t\_SiO_2[\lambda]-0.145404868355688))+420.570041600812\times\\
&((t\_SiO_2[\lambda]-0.145404868355688)\times(t\_SiO_2[\lambda]-0.145404868355688)-0.00124068307615005).
\end{aligned}
\qquad \text{Equation 9}
$$

14. The acoustic wave device according to claim 2, wherein the piezoelectric layer is a lithium tantalate layer;

the piezoelectric layer has crystallographic axes ($X_P$, $Y_P$, $Z_P$);

the plane orientation of the silicon substrate is (100);

in the silicon substrate of which the plane orientation is (100), a directional vector obtained by projecting the $Z_P$-axis onto a (100) plane of the silicon substrate is $k_{100}$, and an angle between the directional vector $k_{100}$ and a [001] direction of silicon that is a component of the silicon substrate is an angle of $\alpha_{100}$; and where the angle $\alpha_{100}$ is Si_psi[deg.], a thickness of the piezoelectric layer is t_LT[λ], a thickness of the silicon nitride layer is t_SiN[λ], a thickness of the silicon oxide layer is t_$SiO_2$[λ], and a thickness of the polysilicon layer is t_$Si_2$[λ], the Si_psi[deg.], the t_LT[λ], the t_SiN[λ], the t_$SiO_2$[λ], and the t_$Si_2$[λ] each are a value within a range with which y in equation 10 is less than or equal to about −80:

$$
\begin{aligned}
y[\text{deg.}]=&(-78.3557914112162)+(-0.00785147182473267)\times(Si\_psi[\text{deg.}]-24.9802110817942)+(-1.32878861667394)\times\\
&(t\_Si_2[\lambda]-0.429221635883905)+(-41.7937386863014)\times(t\_LT[\lambda]-0.150923482849606)+35.6722090195008\times\\
&(t\_SiN[\lambda]-0.0500263852242746)+18.7743164986736\times(t\_SiO_2[\lambda]-0.145646437994723)+(-0.000765722206063909)\times((Si\_psi[\text{deg.}]-24.9802110817942)\times(Si\_psi[\text{deg.}]-24.9802110817942)-153.396706024045)+(-0.0463379291760545)\times((Si\_psi[\text{deg.}]-24.9802110817942)\times(t\_Si_2[\lambda]-0.429221635883905))+(-17.7293821535291)\times\\
&((t\_Si_2[\lambda]-0.429221635883905)\times(t\_Si_2[\lambda]-0.429221635883905)-0.0593208981070862)+(-1.3441873888418)\times((Si\_psi[\text{deg.}]-24.9802110817942)\times(t\_LT[\lambda]-0.150923482849606))+(-417.636233521175)\times\\
&((t\_Si_2[\lambda]-0.429221635883905)\times(t\_LT[\lambda]-0.150923482849606))+(-0.487351707638102)\times\\
&((Si\_psi[\text{deg.}]-24.9802110817942)\times(t\_SiN[\lambda]-0.0500263852242746))+(-25.3025544220714)\times\\
&((t\_Si_2[\lambda]-0.429221635883905)\times(t\_SiN[\lambda]-0.0500263852242746))+1666.3381560311\times\\
&((t\_LT[\lambda]-0.150923482849606)\times(t\_SiN[\lambda]-0.0500263852242746))+233.559062145034\times\\
&((t\_SiN[\lambda]-0.0500263852242746)\times(t\_SiN[\lambda]-0.0500263852242746)-0.000389115398806747)+(-0.148028298904273)\times((Si\_psi[\text{deg.}]-24.9802110817942)\times(t\_SiO_2[\lambda]-
\end{aligned}
$$

$$0.145646437994723))+(-63.9722673973965)\times((t\_Si_{2}[\lambda]-0.429221635883905)\times(t\_SiO_{2}[\lambda]-0.145646437994723))+1197.10044921435\times((t\_LT[\lambda]-0.150923482849606)\times(t\_SiO_{2}[\lambda]-0.145646437994723))+450.45656510444\times((t\_SiN[\lambda]-0.0500263852242746)\times(t\_SiO_{2}[\lambda])-0.145646437994723))+(-37.7857111587959)\times((t\_SiO_{2}[\lambda]-0.145646437994723)\times(t\_SiO_{2}[\lambda]-0.145646437994723)-0.0017158749939084). \qquad \text{Equation 10}$$

15. The acoustic wave device according to claim 2, wherein the piezoelectric layer is a lithium tantalate layer;

the piezoelectric layer has crystallographic axes ($X_P$, $Y_P$, $Z_P$);

the plane orientation of the silicon substrate is (110);

in the silicon substrate of which the plane orientation is (110), a directional vector obtained by projecting the $Z_P$-axis onto a (110) plane of the silicon substrate is $k_{110}$, and an angle between the directional vector $k_{110}$ and a [001] direction of silicon that is a component of the silicon substrate is an angle of $\alpha_{110}$; and where the angle $\alpha_{110}$ is Si_psi[deg.], a thickness of the piezoelectric layer is t_LT[λ], a thickness of the silicon nitride layer is t_SiN[λ], a thickness of the silicon oxide layer is $t\_SiO_2[\lambda]$, and a thickness of the polysilicon layer is $t\_Si_2[\lambda]$, the Si_psi[deg.], the t_LT[λ], the t_SiN[λ], the $t\_SiO_2[\lambda]$, and the $t\_Si_2[\lambda]$ each are a value within a range with which y in equation 11 is less than or equal to about −80:

$$y[\text{deg.}]=(-79.9409825800918)+0.00367175250563163\times(Si\_psi[\text{deg.}]-42.1225309675259)+(-1.19942177285592)\times(t\_Si_{2}[\lambda]-0.381570137261466)+91.8359644721651\times(t\_LT[\lambda]-0.164596585202533)+58.8431912005245\times(t\_SiN[\lambda]-0.0395698024774026)+16.9153289429696\times(t\_SiO_{2}[\lambda]-0.13875125544024)+0.00130491910714855\times((Si\_psi[\text{deg.}]-42.1225309675259)\times(Si\_psi[\text{deg.}]-42.1225309675259)-385.786124427809)+0.0745672315210127\times((Si\_psi[\text{deg}]-42.1225309675259)\times(t\_Si_{2}[\lambda]-0.381570137261466))+2.6699307571413\times((t\_Si_{2}[\lambda]-0.381570137261466)\times(t\_Si_{2}[\lambda]-0.381570137261466)-0.0456605075514713)+(-0.377889849052574)\times((Si\_psi[\text{deg.}]-42.1225309675259)\times(t\_LT[\lambda]-0.164596585202533))+(-43.4148735553507)\times((t\_Si_{2}[\lambda]-0.381570137261466)\times(t\_LT[\lambda]-0.164596585202533))+(-0.378387168121428)\times((Si\_psi[\text{deg.}]-42.1225309675259)\times(t\_SiN[\lambda]-0.0395698024774026))+(-20.545088460627)\times((t\_Si_{2}[\lambda]-0.381570137261466)\times(t\_SiN[\lambda]-0.0395698024774026))+232.919108783203\times((t\_LT[\lambda]-0.164596585202533)\times(t\_SiN[\lambda]-0.0395698024774026))+840.791113736585\times((t\_SiN[\lambda]-0.0395698024774026)\times(t\_SiN[\lambda]-0.0395698024774026)-0.000464855104179262)+0.190837727117146\times((Si\_psi[\text{deg.}]-42.1225309675259)\times(t\_SiO_{2}[\lambda]-0.13875125544024))+0.695837098714372\times((t\_Si_{2}[\lambda]-0.381570137261466)\times(t\_SiO_{2}[\lambda]-0.13875125544024))+(-184.621593720628)\times((t\_LT[\lambda]-0.164596585202533)\times(t\_SiO_{2}[\lambda]-0.13875125544024))+607.033426600094\times((t\_SiN[\lambda]-0.0395698024774026)\times(t\_SiO_{2}[\lambda]-0.13875125544024))+142.721242732228\times((t\_SiO_{2}[\lambda]-0.13875125544024)\times(t\_SiO_{2}[\lambda]-0.13875125544024)-0.00152562510304392). \qquad \text{Equation 11}$$

16. The acoustic wave device according to claim 2, wherein the piezoelectric layer is a lithium tantalate layer;

the piezoelectric layer has crystallographic axes ($X_P$, $Y_P$, $Z_P$);

the plane orientation of the silicon substrate is (111);

in the silicon substrate of which the plane orientation is (111), a directional vector obtained by projecting the $Z_P$-axis onto a (111) plane of the silicon substrate is $k_{111}$, and an angle between the directional vector $k_{111}$ and a [11-2] direction of silicon that is a component of the silicon substrate is an angle of $\alpha_{111}$; and where the angle $\alpha_{111}$ is Si_psi[deg.], a thickness of the piezoelectric layer is t_LT[λ], a thickness of the silicon nitride layer is t_SiN[λ], a thickness of the silicon oxide layer is $t\_SiO_2[\lambda]$, and a thickness of the polysilicon layer is $t\_Si_2[\lambda]$, the Si_psi[deg.], the t_LT[λ], the t_SiN[λ], the $t\_SiO_2[\lambda]$, and the $t\_Si_2[\lambda]$ each are a value within a range with which y in equation 12 is less than or equal to about −80:

$$y[\text{deg.}]=(-79.8683540124538)+0.0118371753456289\times(Si\_psi[\text{deg.}]-44.4595052524568)+(-1.99138796522555)\times(t\_Si_{2}[\lambda]-0.413673331074209)+88.0775643151379\times(t\_LT[\lambda]-0.167705862419511)+46.4734172707698\times(t\_SiN[\lambda]-0.0351321585903086)+14.4134894109961\times(t\_SiO_{2}[\lambda]-0.142222975262623)+0.00167085752221365\times((Si\_psi[\text{deg.}]-44.4595052524568)\times(Si\_psi[\text{deg.}]-44.4595052524568)-128.282924729805)+(-0.0463012101323173)\times((Si\_psi[\text{deg.}]-44.4595052524568)\times(t\_Si_{2}[\lambda]-0.413673331074209))+4.58192618035487\times((t\_Si_{2}[\lambda]-0.413673331074209)\times(t\_Si_{2}[\lambda]-0.413673331074209)-0.05167257915661)+0.524887931323933\times((Si\_psi[\text{deg}]-44.4595052524568)\times(t\_LT[\lambda]-0.167705862419511))+(-71.7492658390069)\times((t\_Si_{2}[\lambda]-0.413673331074209)\times(t\_LT[\lambda]-0.167705862419511))+0.73863390529294\times((Si\_psi[\text{deg.}]-44.4595052524568)\times(t\_SiN[\lambda]-0.0351321585903086))+(-42.8957552454222)\times((t\_Si_{2}[\lambda]-0.413673331074209)\times(t\_SiN[\lambda]-0.0351321585903086))+(-411.839865840595)\times((t\_LT[\lambda]-0.167705862419511)\times(t\_SiN[\lambda]-0.0351321585903086))+982.235412331017\times((t\_SiN[\lambda]-0.0351321585903086)\times(t\_SiN[\lambda]-0.0351321585903086)-0.000477142818756284)+(-0.236509133242243)\times((Si\_psi[\text{deg.}]-44.4595052524568)\times(t\_SiO_{2}[\lambda]-0.142222975262623))+17.2370398551984\times((t\_Si_{2}[\lambda]-0.413673331074209)\times(t\_SiO_{2}[\lambda]-0.142222975262623))+(-469.933137492789)\times((t\_LT[\lambda]-0.167705862419511)\times(t\_SiO_{2}[\lambda]-0.142222975262623))+541.748349798792\times((t\_SiN[\lambda]-0.0351321585903086)\times(t\_SiO_{2}[\lambda]-0.142222975262623))+226.311489477246\times((t\_SiO_{2}[\lambda]-0.142222975262623)\times(t\_SiO_{2}[\lambda]-0.142222975262623)-0.00116579711361478). \qquad \text{Equation 12}$$

17. The acoustic wave device according to claim 4, wherein the piezoelectric layer is a lithium tantalate layer;

the piezoelectric layer has crystallographic axes ($X_P$, $Y_P$, $Z_P$);

the plane orientation of the silicon substrate is (100);

in the silicon substrate of which the plane orientation is (100), a directional vector obtained by projecting the $Z_P$-axis onto a (100) plane of the silicon substrate is $k_{100}$, and an angle between the directional vector $k_{100}$ and a [001] direction of silicon that is a component of the silicon substrate is an angle of $\alpha_{100}$; and where the angle $\alpha_{100}$ is Si_psi[deg.], a thickness of the titanium oxide layer is $t\_TiO_2[\lambda]$, a thickness of the silicon oxide layer is $t\_SiO_2[\lambda]$, and a thickness of the polysilicon layer is $t\_Si_2[\lambda]$, the Si_psi[deg.], the $t\_TiO_2[\lambda]$, the $t\_SiO_2[\lambda]$, and the $t\_Si_2[\lambda]$ each are a value within a range with which y in equation 13 is less than or equal to about −70:

$$y[\text{deg.}]=(-47.9946211404703)+1.21901050350713\times(\mathit{Si\_psi}[\text{deg.}]-19.0566037735849)+4.12041154986452\times(\mathit{t\_Si}_2[\lambda]-0.408490566037736)+228.432202102143\times(\mathit{t\_TiO}_2[\lambda]-0.0288364779874214)+(-33.1253993677708)\times(\mathit{t\_SiO}_2[\lambda]-0.160062893081761)+0.140472008263765\times((\mathit{Si\_psi}[\text{deg,}]-19.0566037735849)\times(\mathit{Si\_psi}[\text{deg.}]-19.0566037735849)-38.1037142518096)+(-5.44594625372052)\times((\mathit{Si\_psi}[\text{deg.}]-19.0566037735849)\times(\mathit{t\_Si}_2[\lambda]-0.408490566037736))+114.747133042737\times((\mathit{t\_Siz}[\lambda]-0.408490566037736)\times(\mathit{t\_Si}_2[\lambda]-0.408490566037736)-0.0406983505399312)+10.4171695197979\times((\mathit{Si\_psi}[\text{deg.}]-19.0566037735849)\times(\mathit{t\_TiO}_2[\lambda]-0.0288364779874214))+(-526.442885320397)\times((\mathit{t\_Si}_2[\lambda]-0.408490566037736)\times(\mathit{t\_TiO}_2[\lambda]-0.0288364779874214))+(-298.795469471375)\times((\mathit{t\_TiO}_2[\lambda]-0.0288364779874214)\times(\mathit{t\_TiO}_2[\lambda]-0.0288364779874214)-0.000424904078161465)+(-50.1009078768921)\times((\mathit{Si\_psi}[\text{deg.}]-19.0566037735849)\times(\mathit{t\_SiO}_2[\lambda]-0.160062893081761))+1038.08065133921\times((\mathit{t\_Si}_2[\lambda])-0.408490566037736)\times(\mathit{t\_SiO}_2[\lambda]-0.160062893081761))+(-1286.74436136556)\times((\mathit{t\_TiO}_2[\lambda]-0.0288364779874214)\times(\mathit{t\_SiO}_2[\lambda]-0.160062893081761))+4158.8148931551\times((\mathit{t\_SiO}_2[\lambda]-0.160062893081761)\times(\mathit{t\_SiO}_2[\lambda]-0.160062893081761)-0.00134527906332819). \quad \text{Equation 13}$$

18. The acoustic wave device according to claim 4, wherein the piezoelectric layer is a lithium tantalate layer;

the piezoelectric layer has crystallographic axes ($X_P$, $Y_P$, $Z_P$);

the plane orientation of the silicon substrate is (110);

in the silicon substrate of which the plane orientation is (110), a directional vector obtained by projecting the $Z_P$-axis onto a (110) plane of the silicon substrate is $k_{110}$, and an angle between the directional vector $k_{110}$ and a [001] direction of silicon that is a component of the silicon substrate is an angle of $\alpha_{110}$; and where the angle $\alpha_{110}$ is Si_psi[deg.], a thickness of the titanium oxide layer is t_TiO$_2$[λ], a thickness of the silicon oxide layer is t_SiO$_2$[λ], and a thickness of the polysilicon layer is t_Si$_2$[λ], the Si_psi[deg.], the t_TiO$_2$[λ], the t_SiO$_2$[λ], and the t_Si$_2$[λ] each are a value within a range with which y in equation 14 is less than or equal to about −70:

$$y[\text{deg.}]=(-66.0681190864303)+(-0.0323391014318074)\times(\mathit{Si\_psi}[\text{deg.}]-35.9295352323838)+0.997507104337367\times(\mathit{t\_Si}_2[\lambda]-0.394527736131933)+155.754971155735\times(\mathit{t\_TiO}_2[\lambda]-0.0378860569715143)+(-27.4736558331949)\times(\mathit{t\_SiO}_2[\lambda]-0.149887556221888)+0.00791197424152189\times((\mathit{Si\_psi}[\text{deg.}]-35.9295352323838)\times(\mathit{Si\_psi}[\text{deg.}]-35.9295352323838)-256.81962242267)+0.212504000649305\times((\mathit{Si\_psi}[\text{deg.}]-35.9295352323838)\times(\mathit{t\_Si}_2[\lambda]-0.394527736131933))+88.6294722534935\times((\mathit{t\_Si}_2[\lambda]-0.394527736131933)\times(\mathit{t\_Si}_2[\lambda]-0.394527736131933)-0.0392241772666888)+0.636412965393882\times((\mathit{Si\_psi}[\text{deg.}]-35.9295352323838)\times(\mathit{t\_TiO}_2[\lambda]-0.0378860569715143))+157.120610191294\times((\mathit{t\_Si}_2[\lambda]-0.394527736131933)\times(\mathit{t\_TiO}_2[\lambda]-0.0378860569715143))+544.188337615988\times((\mathit{t\_TiO}_2[\lambda]-0.0378860569715143)\times(\mathit{t\_TiO}_2[\lambda]-0.0378860569715143)-0.000522930045472021)+0.408031229502175\times((\mathit{Si\_psi}[\text{deg.}]-35.9295352323838)\times(\mathit{t\_SiO}_2[\lambda]-0.149887556221888))+(-46.0736528123303)\times((\mathit{t\_Si}_2[\lambda]-0.394527736131933)\times(\mathit{t\_SiO}_2[\lambda]-0.149887556221888))+(-1322.9465191866)\times((\mathit{t\_TiO}_2[\lambda]-0.0378860569715143)\times(\mathit{t\_SiO}_2[\lambda]-0.149887556221888))+359.098768522305\times((\mathit{t\_SiO}_2[\lambda])-0.149887556221888)\times(\mathit{t\_SiO}_2[X]-0.149887556221888)-0.00163979245384803). \quad \text{Equation 14}$$

19. The acoustic wave device according to claim 4, wherein the piezoelectric layer is a lithium tantalate layer;

the piezoelectric layer has crystallographic axes ($X_P$, $Y_P$, $Z_P$);

the plane orientation of the silicon substrate is (111);

in the silicon substrate of which the plane orientation is (111), a directional vector obtained by projecting the $Z_P$-axis onto a (111) plane of the silicon substrate is $k_{111}$, and an angle between the directional vector $k_{111}$ and a [11-2] direction of silicon that is a component of the silicon substrate is an angle of $\alpha_{111}$; and where the angle $\alpha_{111}$ is Si_psi[deg.], a thickness of the piezoelectric layer is t_LT[λ], a thickness of the titanium oxide layer is t_TiO$_2$[λ], a thickness of the silicon oxide layer is t_SiO$_2$[λ], and a thickness of the polysilicon layer is t_Si$_2$[λ], the Si_psi[deg.], the t_LT[λ], the t_TiO$_2$[λ], the t_SiO$_2$[λ], and the t_Si$_2$[λ] each are a value within a range with which y in equation 15 is less than or equal to about −70:

$$y[\text{deg.}]=(-69.4030815485713)+(-0.269371737613053)\times(\mathit{Si\_psi}[\text{deg.}]-33.8730694980695)+(-4.68577968707475)\times(\mathit{t\_Si}_2[\lambda]-0.440745656370656)+176.177168052005\times(\mathit{t\_LT}[\lambda]-0.168858590733587)+73.1412385401181\times(\mathit{t\_TiO}_2[\lambda]-0.0300916988416992)+(-12.3739066281753)\times(\mathit{t\_SiO}_2[\lambda]-0.154983108108108)+0.00777703537774127\ C((\mathit{Si\_psi}[\text{deg.}]-33.8730694980695)\times(\mathit{Si\_psi}[\text{deg.}]-33.8730694980695)-508.406668570442)+0.121265989497045\times((\mathit{Si\_psi}[\text{deg.}]-33.8730694980695)\times(\mathit{t\_Si}_2[\lambda]-0.440745656370656))+17.8168374568741\times((\mathit{t\_Si}_2[\lambda]-0.440745656370656)\times(\mathit{t\_Si}_2[\lambda]-0.440745656370656)-0.0493816592475423)+1.34130425597794\times((\mathit{Si\_psi}[\text{deg.}]-33.8730694980695)\times(\mathit{t\_LT}[\lambda]-0.168858590733587))+(-5.11032690396319)\times((\mathit{t\_Si}_2[\lambda]-0.440745656370656)\times(\mathit{t\_LT}[\lambda]-0.168858590733587))+2.48016332864734\times((\mathit{Si\_psi}[\text{deg.}]-33.8730694980695)\times(\mathit{t\_TiO}_2[\lambda]-0.0300916988416992))+77.8145877606436\times((\mathit{t\_Si}_2[\lambda]-0.440745656370656)\times(\mathit{t\_TiO}_2[\lambda]-0.0300916988416992))+2112.87481803881\times((\mathit{t\_LT}[\lambda]-0.168858590733587)\times(\mathit{t\_TiO}_2[\lambda]-0.0300916988416992))+196.040518466468\times((\mathit{t\_TiO}_2[\lambda]-0.0300916988416992)\times(\mathit{t\_TiO}_2[\lambda]-0.0300916988416992)-0.000562395066225887)+(-0.969575065396993)\times((\mathit{Si\_psi}[\text{deg.}]-33.8730694980695)\times(\mathit{t\_SiO}_2[\lambda]-0.154983108108108))+(-138.70694337489)\times((\mathit{t\_Si}_2[\lambda]-0.440745656370656)\times(\mathit{t\_SiO}_2[\lambda]-0.154983108108108))+(-1100.04408119143)\times((\mathit{t\_LT}[\lambda]-0.168858590733587)\times(\mathit{t\_SiO}_2[\lambda]-0.154983108108108))+74.9944030678128\times((\mathit{t\_TiO}_2[\lambda]-0.0300916988416992)\times(\mathit{t\_SiO}_2[\lambda]-0.154983108108108))+117.812778429437\times((\mathit{t\_SiO}_2[\lambda]-0.154983108108108)\times(\mathit{t\_SiO}_2[\lambda]-0.154983108108108)-0.00117057162586093). \quad \text{Equation 15}$$

20. The acoustic wave device according to claim 4, wherein the piezoelectric layer is a lithium tantalate layer;

the piezoelectric layer has crystallographic axes ($X_P$, $Y_P$, $Z_P$);

the plane orientation of the silicon substrate is (110);

in the silicon substrate of which the plane orientation is (110), a directional vector obtained by projecting the $Z_P$-axis onto a (110) plane of the silicon substrate is $k_{110}$, and an angle between the directional vector $k_{110}$ and a [001] direction of silicon that is a component of the silicon substrate is an angle of $\alpha_{110}$; and where the angle $\alpha_{110}$ is Si_psi[deg.], a thickness of the titanium oxide layer is $t\_TiO_2[\lambda]$, a thickness of the silicon oxide layer is $t\_SiO_2[\lambda]$, and a thickness of the polysilicon layer is $t\_Si_2[\lambda]$, the Si_psi[deg.], the $t\_TiO_2[\lambda]$, the $t\_SiO_2[\lambda]$, and the $t\_Si_2[\lambda]$ each are a value within a range with which y in equation 16 is less than or equal to about −80:

$$
\begin{aligned}
y[\text{deg.}]=&(-77.5229944626225)+(-0.0245637365901893)\times(Si\_psi[\text{deg.}]-34.5205479452055)+(-1.18326432300356)\times\\
&(t\_Si_2[\lambda]-0.408904109589041)+131.275052857081\times(t\_TiO_2[\lambda]-0.0160045662100456)+(-18.9167659640434)\times\\
&(t\_SiO_2[\lambda]-0.150228310502283)+0.00233031321934999\times((Si\_psi[\text{deg.}]-34.5205479452055)\times(Si\_psi[\text{deg.}]-\\
&34.5205479452055)-75.9116782385689)+(-0.0809397438263331)\times((Si\_psi[\text{deg.}]-34.5205479452055)\times(t\_Si_2[\lambda]-\\
&0.408904109589041))+43.1653284334043\times((t\_Si_2[\lambda]-0.408904109589041)\times(t\_Si_2[\lambda]-0.408904109589041)-0.0169869268780884)+\\
&(-0.255179621676294)\times((Si\_psi[\text{deg.}]-34.5205479452055)\times(t\_TiO_2[\lambda])-0.0160045662100456))+(-101.438420329361)\times\\
&((t\_Si_2[\lambda]-0.408904109589041)\times(t\_TiO_2[\lambda]-0.0160045662100456))+(-834.553397134957)\times\\
&((t\_TiO_2[\lambda]-0.0160045662100456)\times(t\_TiO_2[\lambda]-0.0160045662100456)-0.000126844728008173)+0.935627393438751\times\\
&((Si\_psi[\text{deg.}]-34.5205479452055)\times(t\_SiO_2[\lambda])-0.150228310502283))+(-21.1152350576513)\times\\
&((t\_Si_2[\lambda]-0.408904109589041)\times(t\_SiO_2[\lambda]-0.150228310502283))+(-41.8110780477077)\times\\
&((t\_TiO_2[\lambda]-0.0160045662100456)\times(t\_SiO_2[\lambda]-0.150228310502283))+263.939639423742\times\\
&((t\_SiO_2[\lambda]-0.150228310502283)\times(t\_SiO_2[\lambda]-0.150228310502283)-0.00160953691541044). \quad \text{Equation 16}
\end{aligned}
$$

21. The acoustic wave device according to claim 4, wherein the piezoelectric layer is a lithium tantalate layer;

the piezoelectric layer has crystallographic axes ($X_P$, $Y_P$, $Z_P$);

the plane orientation of the silicon substrate is (111);

in the silicon substrate of which the plane orientation is (111), a directional vector obtained by projecting the $Z_P$-axis onto a (111) plane of the silicon substrate is $k_{111}$, and an angle between the directional vector $k_{111}$ and a [11-2] direction of silicon that is a component of the silicon substrate is an angle of $\alpha_{111}$; and where the angle $\alpha_{111}$ is Si_psi[deg.], a thickness of the piezoelectric layer is t_LT[λ], a thickness of the titanium oxide layer is $t\_TiO_2[\lambda]$, a thickness of the silicon oxide layer is $t\_SiO_2[\lambda]$, and a thickness of the polysilicon layer is $t\_Si_2[\lambda]$, the Si_psi[deg.], the t_LT[λ], the $t\_TiO_2[\lambda]$, the $t\_SiO_2[\lambda]$, and the $t\_Si_2[\lambda]$ each are a value within a range with which y in equation 17 is less than or equal to about −80:

$$
\begin{aligned}
y[\text{deg.}]=&(-78.9096176038851)+0.034903516437231\times(Si\_psi[\text{deg.}]-45.8453473132372)+(-2.02533584474356)\times(t\_Si_2[\lambda]-\\
&0.421068152031454)+81.4363661536651\times(t\_LT[\lambda]-0.156225425950199)+71.7903756668229\times\\
&(t\_TiO_2[\lambda]-0.0334862385321101)+(-3.53261283561548)\times(t\_SiO_2[\lambda]-0.149606815203146)+0.00246176329064131\times\\
&((Si\_psi[\text{deg.}]-45.8453473132372)\times(Si\_psi[\text{deg.}]-45.8453473132372)-143.191023568758)+(-0.0293712406566626)\times\\
&((Si\_psi[\text{deg.}]-45.8453473132372)\times(t\_Si_2[\lambda]-0.421068152031454))+0.972512275661977\times\\
&((t\_Si_2[\lambda]-0.421068152031454)\times(t\_Si_2[\lambda]-0.421068152031454)-0.0430997109516307)+0.30260322985253\times\\
&((Si\_psi[\text{deg.}]-45.8453473132372)\times(t\_LT[\lambda]-0.156225425950199))+(-23.2249863870645)\times\\
&((t\_Si_2[\lambda]-0.421068152031454)\times(t\_LT[\lambda]-0.156225425950199))+0.513496313876766\times\\
&((Si\_psi[\text{deg.}]-45.8453473132372)\times(t\_TiO_2[\lambda]-0.0334862385321101))+(-143.065209527507)\times\\
&((t\_Si_2[\lambda]-0.421068152031454)\times(t\_TiO_2[\lambda]-0.0334862385321101))+(-324.329178613173)\times\\
&((t\_LT[\lambda]-0.156225425950199)\times(t\_TiO_2[\lambda]-0.0334862385321101))+(-98.4001544132927)\times\\
&((t\_TiO_2[\lambda]-0.0334862385321101)\times(t\_TiO_2[\lambda]-0.0334862385321101)-0.000480867110753061)+(-1.15889670547368)\times\\
&((Si\_psi[\text{deg.}]-45.8453473132372)\times(t\_SiO_2[\lambda]-0.149606815203146))+(-50.3263112114924)\times\\
&((t\_Si_2[\lambda]-0.421068152031454)\times(t\_SiO_2[\lambda]-0.149606815203146))+(-209.199256641353)\times\\
&((t\_LT[\lambda]-0.156225425950199)\times(t\_SiO_2[\lambda]-0.149606815203146))+90.23187502294813\times\\
&((t\_TiO_2[\lambda]-0.0334862385321101)\times(t\_SiO_2[\lambda]-0.149606815203146))+347.448658314796\times\\
&((t\_SiO_2[\lambda]-0.149606815203146)\times(t\_SiO_2[\lambda]-0.149606815203146)-0.00114008131659363). \quad \text{Equation 17}
\end{aligned}
$$

22. The acoustic wave device according to claim 1, wherein the piezoelectric layer is a lithium niobate layer.

* * * * *